(12) United States Patent
Cha et al.

(10) Patent No.: US 10,846,169 B2
(45) Date of Patent: Nov. 24, 2020

(54) SEMICONDUCTOR MEMORY DEVICES, MEMORY SYSTEMS AND METHODS OF OPERATING SEMICONDUCTOR MEMORY DEVICES

(71) Applicant: Samsung Electronics Co., Ltd., Suwon-si (KR)

(72) Inventors: Sang-Uhn Cha, Suwon-si (KR); Nam-Sung Kim, Yongin-si (KR); Kyo-Min Sohn, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/384,319

(22) Filed: Apr. 15, 2019

(65) Prior Publication Data

US 2020/0151053 A1 May 14, 2020

(30) Foreign Application Priority Data

Nov. 9, 2018 (KR) .......................... 10-2018-0136992

(51) Int. Cl.
| | | |
|---|---|---|
| *G11C 29/00* | (2006.01) | |
| *G06F 11/10* | (2006.01) | |
| *G11C 29/42* | (2006.01) | |
| *G11C 29/44* | (2006.01) | |
| *G11C 29/52* | (2006.01) | |

(52) U.S. Cl.
CPC ...... *G06F 11/1048* (2013.01); *G06F 11/1044* (2013.01); *G11C 29/42* (2013.01); *G11C 29/44* (2013.01); *G11C 29/52* (2013.01)

(58) Field of Classification Search
CPC .. G06F 11/1048; G06F 11/1044; G11C 29/42; G11C 29/44; G11C 29/52
See application file for complete search history.

(56) References Cited

U.S. PATENT DOCUMENTS

| | | |
|---|---|---|
| 8,949,690 B2 | 2/2015 | Sugahara et al. |
| 9,652,323 B2 | 5/2017 | Minzoni et al. |
| 9,691,505 B2 | 6/2017 | Das et al. |
| 9,823,966 B1 | 11/2017 | Ware et al. |
| 10,156,995 B2 | 12/2018 | Cha et al. |
| 2006/0218467 A1 | 9/2006 | Sibigtroth et al. |

(Continued)

FOREIGN PATENT DOCUMENTS

| | | |
|---|---|---|
| CN | 107393596 A | 11/2017 |
| KR | 20160017922 A | 2/2016 |

*Primary Examiner* — Samir W Rizk
(74) *Attorney, Agent, or Firm* — Muir Patent Law, PLLC

(57) ABSTRACT

Semiconductor memory device includes a memory cell array and an interface circuit including an ECC engine. The memory cell array includes a normal cell region and a parity cell region including a first sub parity region and a second sub parity region. The interface circuit receives main data and sub data comprising external parity or a data mask signal, generates a flag signal based on mask bits of the data mask signal, performs ECC encoding operation on the main data in response to an operation mode and the flag signal, stores the main data in the normal cell region, stores either the external parity or the flag signal in the second sub parity region in response to the operation mode, performs an ECC decoding operation on the main data read from the normal cell region in response to the operation mode and the flag signal.

20 Claims, 22 Drawing Sheets

(56) References Cited

U.S. PATENT DOCUMENTS

2013/0031439 A1* 1/2013 Moon ............... G06F 11/1048
714/758
2015/0221612 A1* 8/2015 Gandhi ............... H01L 24/17
257/753
2016/0041872 A1 2/2016 Ku et al.

* cited by examiner

410

SEMICONDUCTOR MEMORY DEVICES, MEMORY SYSTEMS AND METHODS OF OPERATING SEMICONDUCTOR MEMORY DEVICES

CROSS-REFERENCE TO RELATED APPLICATION

This application claims priority under 35 U.S.C. § 119 to Korean Patent Application No. 10-2018-0136992, filed on Nov. 9, 2018, in the Korean Intellectual Property Office (KIPO), the disclosure of which is incorporated in its entirety by reference herein.

BACKGROUND

1. Technical Field

Example embodiments relate to memories, and more particularly to semiconductor memory devices, memory systems and methods of operating semiconductor memory devices.

2. Discussion of the Related Art

Both the capacity and speed of semiconductor memory devices, which may be used as storage devices in most recent memory systems, are increasing. Furthermore, various attempts are being made for mounting a memory with a larger capacity within a smaller space and efficiently operating the memory.

Recently, in order to increase the integration of semiconductor memory devices, a 3-dimensional (3D) structure including a plurality of stacked memory chips is being applied instead of a 2-dimensional (2D) structure. Based on demand for large integration and large capacity memories, a structure that employs a 3D stacked structure of the memory chips for increasing the capacity of a memory, increasing integration by reducing the size of a semiconductor chip, and reducing cost for manufacturing the same has been developed.

Semiconductor memory devices may be classified into non-volatile memory devices such as flash memory devices and volatile memory devices such as dynamic random access memories (DRAMs). High speed operation and cost efficiency of DRAMs make it possible for DRAMs to be used for system memories. Due to the continuing shrink in fabrication design rule of DRAMs, bit errors of memory cells in the DRAMs may rapidly increase and yield of the DRAMs may decrease. Therefore, the DRAMs reduce the bit errors by employing an error correction code (ECC) engine therein. The ECC engine often uses a region of memory to store parity bits (e.g., a parity cell region) as part of detecting and correcting erroneous bits (or error bits) of a certain set of data. In a particular operation mode, a portion of the parity cell region may not be used, thus it is desired to increase usability of the parity cell region.

SUMMARY

Some example embodiments provide a semiconductor memory device capable of supporting various specifications.

Some example embodiments provide a memory system including a semiconductor memory device capable of supporting various specifications.

Some example embodiments provide a method of operating a semiconductor memory device. capable of supporting various specifications.

According to example embodiments, a semiconductor memory device includes a first memory die including a memory cell array, and an interface circuit including an error correction code (ECC) engine. The memory cell array includes a plurality of memory cells coupled to a plurality of word-lines and a plurality of bit-lines, and the memory cell array includes a normal cell region and a parity cell region including a first sub parity region and a second sub parity region. The interface circuit receives main data and sub data from an external device, the sub data comprising external parity or a data mask signal received from the external device, generates a first flag signal based on mask bits of the data mask signal, performs an ECC encoding operation on the main data to generate internal parity in response to an operation mode selectable by a command from the external device and the first flag signal, stores the main data in the normal cell region, stores either the external parity or the first flag signal in the second sub parity region in response to the operation mode, and performs an ECC decoding operation on the main data read from the normal cell region to generate a corrected main data in response to the operation mode and the first flag signal.

According to example embodiments, a memory system includes a memory controller and a semiconductor memory device. The memory controller including a first error correction code (ECC) engine, generates a command, main data and sub data, the main data and the sub data being generated in response to first data. The semiconductor memory device receives the command, the main data and the sub data from the memory controller. The semiconductor memory device includes a first memory die including a memory cell array, and an interface circuit including a second ECC engine. The memory cell array includes a plurality of memory cells coupled to a plurality of word-lines and a plurality of bit-lines, and the memory cell array includes a normal cell region and a parity cell region including a first sub parity region and a second sub parity region. The interface circuit receives the main data and the sub data from the memory controller, the sub data comprising external parity or a data mask signal received from the memory controller, generates a first flag signals based on mask bits of the data mask signal, performs an ECC encoding operation on the main data to generate internal parity in response to an operation mode selectable by a command from the external device and the first flag signal, stores the main data in the normal cell region, stores either the external parity or the first flag signal in the second sub parity region in response to the operation mode, and performs an ECC decoding operation on the main data read from the normal cell region to generate a corrected main data in response to the operation mode and the first flag signal.

According to example embodiments, there is provided a method of operating a semiconductor memory device and the semiconductor memory device includes a buffer die to communicate with an external device, one or more memory dies stacked on the buffer die, a plurality of through substrate vias (TSVs) extending through the one or more memory dies to connect to the buffer die, each of the one or more memory dies includes a memory cell array, and the memory cell array includes a plurality of memory cells coupled to a plurality of word-lines and a plurality of bit-lines and includes a normal cell region and a parity cell region including a first sub parity region and a second sub parity region. In the method, a first command, main data and sub data are received from the external device, whether the first command designates an external ECC mode or a data mask mode is determined, the main data is stored in the normal cell region in response to the first command designating the external ECC mode or the data mask mode, external parity included in the sub data is stored in the second sub parity region in response to the first command designating the external ECC mode, a flag signal generated based on mask bits of a data mask signal included in the sub data is stored in the second sub parity region in response to the first command designating the data mask mode, a second command is received from the external device and in response to the second command and a logic level of the flag signal read from the second sub parity region, an ECC decoding is performed on the main data read from the normal cell region.

Accordingly, the semiconductor memory device may perform an ECC encoding and an ECC decoding based on an operation mode selectable by a command and a data mask signal. Therefore, the semiconductor memory device may support various specifications.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Example embodiments will be described more fully hereinafter with reference to the accompanying drawings.

Figure 1:
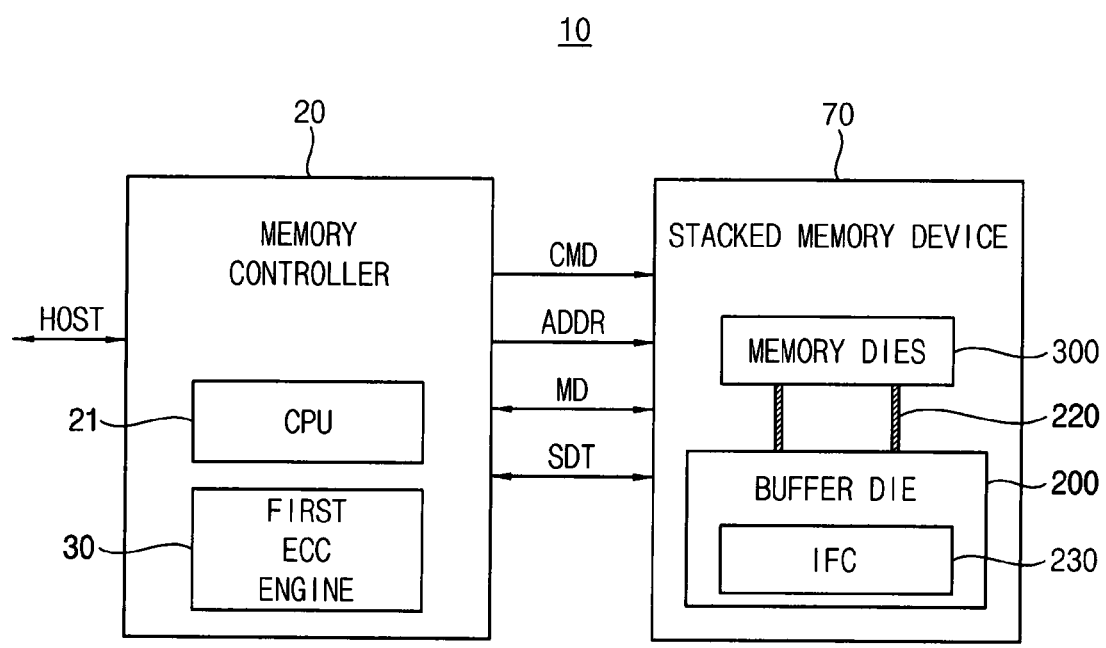
FIG. 1 is a block diagram illustrating a memory system according to example embodiments.

FIG. 1 is a block diagram illustrating a memory system according to example embodiments.

Referring to FIG. 1, a memory system 10 includes a memory controller 20 and a semiconductor memory device 70. As an example, the semiconductor memory device 70 may be a stacked memory device and may be referred to as a stacked memory device.

The memory controller 20 may include a central processing unit (CPU) 21 and a first error correction code (ECC) engine 30, provide a command CMD and an address to the stacked memory device 70 and exchange main data MD and sub data SDT with the stacked memory device 70. The sub data SDT may include external parity in an external ECC mode and may include a data mask signal including data mask bits in a data mask mode.

The memory controller 20 may access the stacked memory device 70 based on a request from an external host. The memory controller 20 may communicate with the host through various protocols.

The stacked memory device 70 may include a buffer die 200 and a plurality of memory dies 300 stacked on the buffer die 200. As will be understood, dies referenced herein, such as the memory dies 300 and the buffer die 200, may each be a semiconductor chip (cut from a wafer). In some examples, the memory dies 300 may instead be only one memory die. The buffer die 200 and the memory dies 300 may be sequentially stacked on each other. The memory dies 300 stacked on the buffer die 200 may be electrically connected to the buffer die 200 through conducting means. The conducting means may be one or more through substrate vias (TSVs) 220. The through substrate vias (TSVs) may be through silicon vias in some examples (e.g., when extending through a silicon substrate). Each of the TSVs 220 may form all or part of a wiring that extends between opposite sides of each of the memory dies 300 in which it is formed. TSVs of each of the memory dies 300 may penetrate through the substrate of each of the memory dies 300 (e.g., when connected to patterned wiring on the active surface of each of the memory dies 300) and may also be formed to penetrate through the entire memory die (including its substrate) of each of the memory dies 300.

The buffer die 200 may communicate with the memory controller 20 and each of the memory dies 300 may be a dynamic random access memory (DRAM) device including a plurality of dynamic memory cells, such as Double Data Rate (DDR) Synchronous Dynamic Random Access Memory (SDRAM). Each of the memory dies 300 may include a memory cell array, the memory cell array may include a normal cell region and a parity cell region and the parity cell region may include a first sub parity region and a second sub parity region.

The buffer die 200 may include an interface circuit 230. The interface circuit 230, in a write operation of the stacked memory device (or the semiconductor memory device) 70, may receive the main data MD and the sub data SDT from the memory controller (an external device) 20, may perform an ECC encoding operation on the main data MD in response to an operation mode selectable by the command CMD from the memory controller 20, may store the main data MD in the normal cell region in one of the memory dies 300, and may store duplicated flag signals in the second sub parity region. The duplicated flag signals may be generated based on the external parity or the data mask signal included in the sub data SDT. The interface circuit 230, in a read operation, may perform an ECC decoding operation on the main data MD read from the normal cell region, based on logic levels of the duplicated flag signals.

Figure 2:
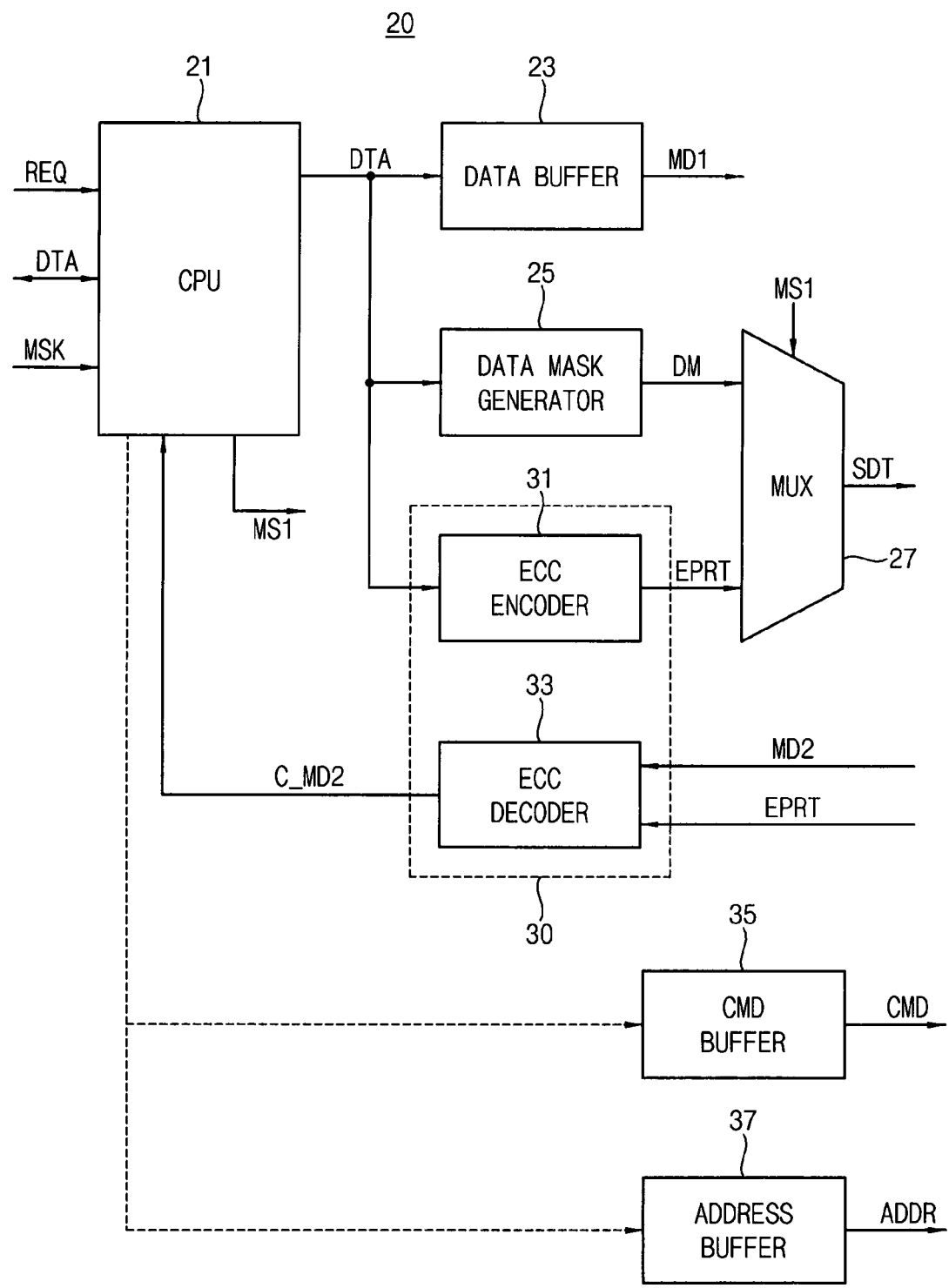
FIG. 2 is a block diagram illustrating the memory controller in the memory system of FIG. 1 according to example embodiments.

FIG. 2 is a block diagram illustrating the memory controller in the memory system of FIG. 1 according to example embodiments.

Referring to FIG. 2, the memory controller 20 may include the CPU 21, a data buffer 23, a data mask generator 25, a selection circuit 27, the first ECC engine 30, a command buffer 35 and an address buffer 37. The first ECC engine 30 may include an ECC encoder 31 and an ECC decoder 33.

The CPU 21 receives a request REQ, a data DTA and a mask signal MSK from the host, and provides the data DTA to the data buffer 23, the data mask generator 25 and the ECC encoder 31. The CPU 21 generates a first mode signal MS1 designating one of the external ECC mode and the data mask mode in response to the mask signal MSK and provides the first mode signal MS1 to the selection circuit 27.

The data buffer 23 buffers the data DTA to provide a first main data MD1 to the stacked memory device 70. The data mask generator 25 may generate a data mask signal DM including mask bits (or data mask bits) in response to the mask signal MSK and provide the data mask signal DM to the selection circuit 27. Each of the mask bits designates whether to write corresponding unit data in the data DTA. The ECC encoder 31 performs an ECC encoding operation on the data DTA to generate external parity EPRT and provides the external parity EPRT to the selection circuit 27. The selection circuit 27 outputs the external parity EPRT as the sub data SDT in response to the first mode signal MS1 designating the external ECC mode or outputs the data mask signal DM as the sub data SDT in response to the first mode signal MS1 designating the data mask mode.

The ECC decoder 33, in a read operation, receives a second main data MD2 and the external parity EPRT from the stacked memory device 70, performs an ECC decoding operation on the second main data MD2 based on the external parity EPRT and provides a corrected main data C_MD2 to the CPU 21. The CPU 21 provides the corrected main data C_MD2 to the host.

The command buffer 35 stores the command CMD corresponding to the request REQ and transmits the command CMD to the stacked memory device 70 under control of the CPU 21. The address buffer 37 stores the address ADDR and transmits the address ADDR to the stacked memory device 70 under control of the CPU 21.

Figure 3:
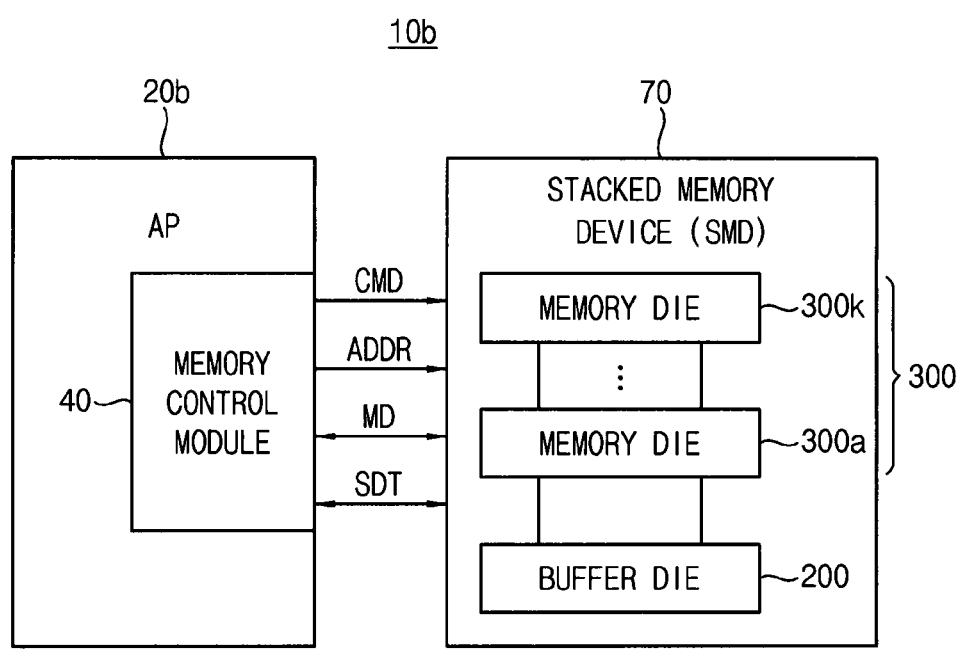
FIG. 3 is a block diagram illustrating a data processing system according to example embodiments.

FIG. 3 is a block diagram illustrating a data processing system according to example embodiments.

Referring to FIG. 3, a data processing system 10b may include an application processor 20b and a stacked memory device 70. The application processor 20b may include a memory control module 40. The memory control module 40 included in application processor 20b and the stacked memory device 70 may constitute a memory system.

The application processor 20b may perform a function of the host. Further, the application processor 20b may be implemented as a system on chip (SoC). The SoC may include a system bus (not illustrated) to which a protocol having a predetermined standard bus specification is applied, and may include various types of intellectual property (IP) cores connected to the system bus.

The memory control module 40 may perform a function of the memory controller 20 in FIG. 1.

Figure 4:
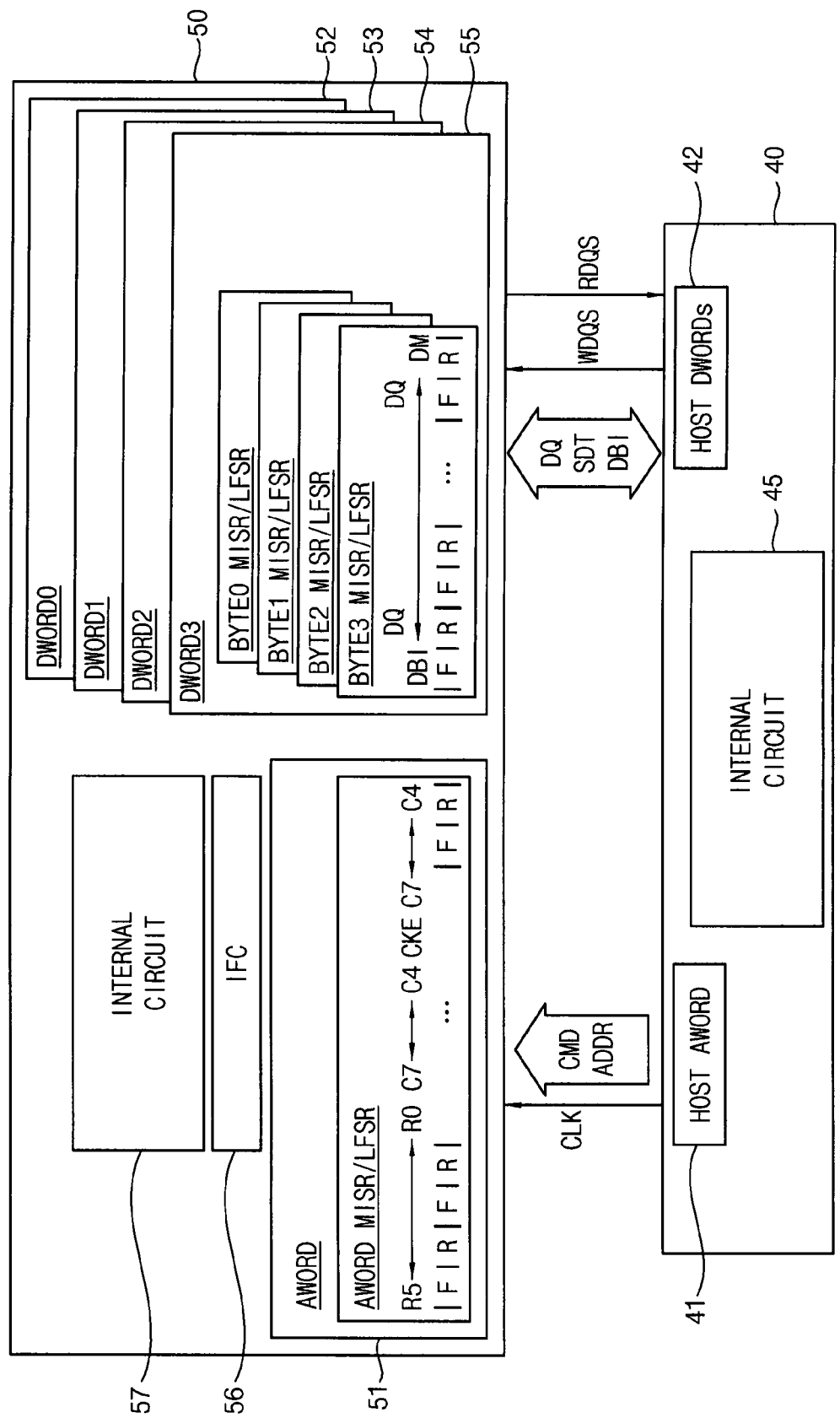
FIG. 4 illustrates a diagram illustrating a memory system according to example embodiments.

FIG. 4 illustrates a diagram illustrating a memory system according to example embodiments.

Referring to FIG. 4, a memory system 10c may include a memory controller 40 and a semiconductor memory device 50. The semiconductor memory device 50 may include a command-address input-output block AWORD 51, data input-output blocks DWORD0~DWORD3 52~55, an interface circuit 56 and an internal circuit 57. The memory controller 40 may include a command-address input-output block 41, data input-output blocks 42 and an internal circuit 45. For example, the semiconductor memory device 50 may be compatible with high bandwidth memory (HBM) specifications.

The command CMD, an address ADDR, a system clock signal CLK, a clock enable signal CKE, etc. may be transferred from the command-address input-output block 41 of the memory controller 40 to the command-address input-output block 51 of the semiconductor memory device 50. Data DQ, a data bus inversion signal DBI, sub data SDT, a write data strobe signal WDQS, a read data strobe signal RDQS, etc. may be transferred between the data input-output blocks 42 of the memory controller 40 and the data input-output blocks 52~55 of the semiconductor memory device 50. The sub data SDT may include external parity or a data mask signal.

A multiple-input shift register (MISR) and/or A linear feedback shift register (LFSR) may be implemented in the input-output blocks 51~55 of the semiconductor memory device 50. Using the MISR/LFSR circuits, the links between the memory controller 40 and the semiconductor memory device 50 may be tested and trained.

For example, as illustrated in FIG. 4, the MISR/LFSR circuit corresponding to one byte included in the data input-output blocks 52~55 may have a size of 20 bits. The 20 bits may include rising bits R and falling bits F of the byte data signal, the data bus inversion signal DBI and the data mask signal DM. The MISR/LFSR circuit of the command address input-output block 51 may have a size of 30 bits. The 30 bits may include rising bits R and falling bits F of the row command bits R0~R5, the column command bits C0~C7 and the clock enable signal CKE.

For example, one channel includes four data input-output blocks 52~55 corresponding to four words, and each of the four data input-output blocks 52~55 may include four MISR/LFSR circuits corresponding to four bytes BYTE0~BYTE3.

The interface circuit 56 may correspond to the interface circuit 230 in FIG. 1 and the internal circuit 57 may include a memory cell array and a peripheral circuit.

Figure 5:
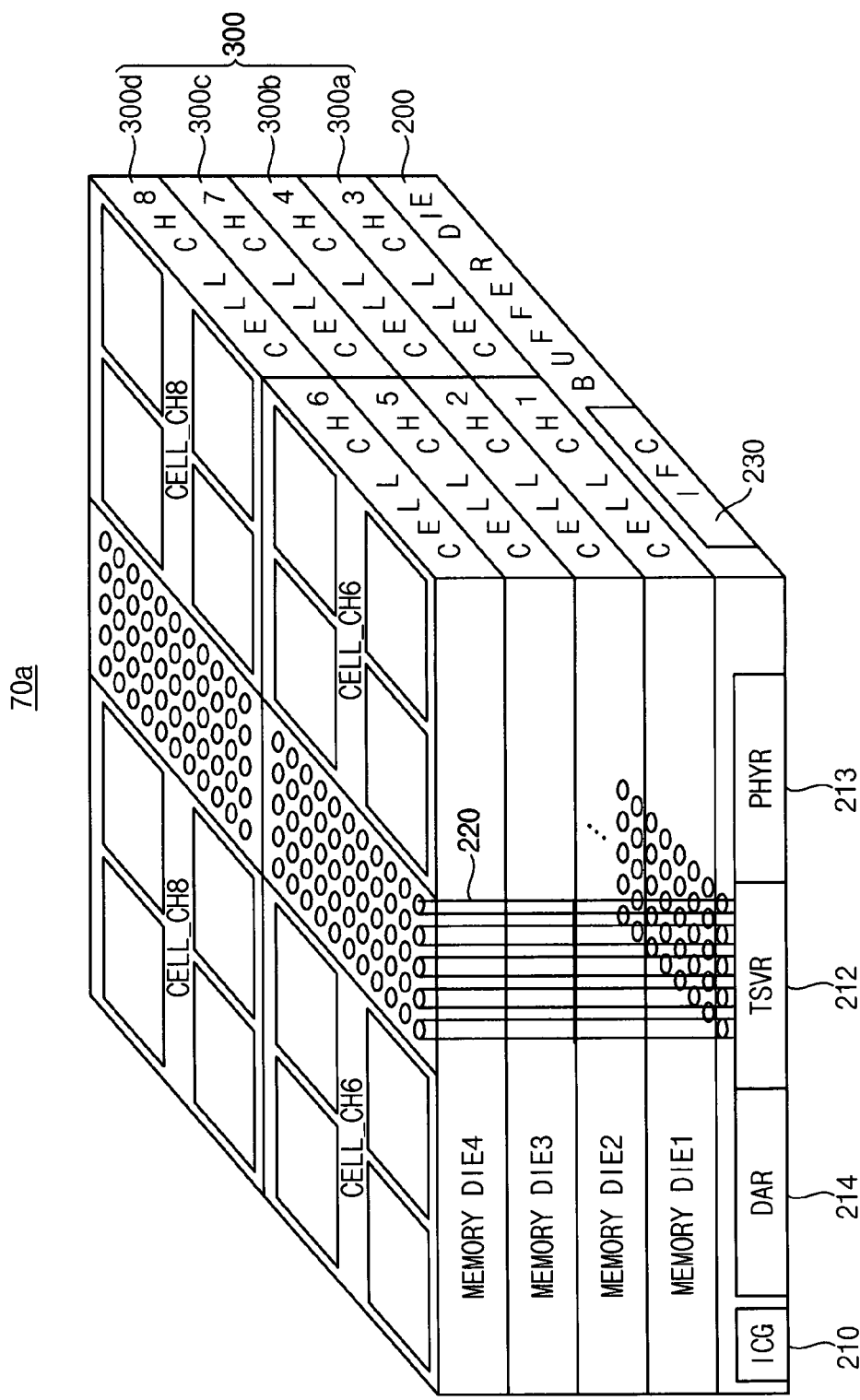
FIG. 5 is a block diagram illustrating an example of the stacked memory device in FIG. 1 according to example embodiments.

FIG. 5 is a block diagram illustrating an example of the stacked memory device in FIG. 1 according to example embodiments.

In FIG. 5, a memory device in a high bandwidth memory (HBM) form having an increased bandwidth by including a plurality of independent channels having independent interfaces is illustrated.

Referring to FIG. 5, a stacked memory device 70a may include a plurality of layers. For example, the stacked memory device 70a may include the buffer die 200 and one or more memory dies 300 which are stacked on the buffer die 200. In the example of FIG. 5, although first to fourth memory dies 300a to 300d are illustrated as being provided, the number of the memory dies may be variously changed.

Further, each of the memory dies 300 may include one or more channels. A single memory die includes two channels in the example of FIG. 5, and thus an example in which the stacked memory device 70a has eight channels CH1 to CH8 is illustrated.

For example, a first memory die 300a may include a first channel CH1 and a third channel CH3, a second memory die 300b may include a second channel CH2 and a fourth channel CH4, a third memory die 300c may include a fifth memory channel CH5 and a seventh channel CH7, and a fourth memory die 300d may include a sixth channel CH6 and an eighth channel CH8.

The buffer die 200 may communicate with the memory controller (an external device), receive a command, an address, and data from the memory controller, and provide the received command, address, and data to the memory dies 300. The buffer die 200 may communicate with the memory controller through a conductive means (not illustrated) such as bumps and the like which are formed on an outer surface thereof. The buffer die 200 may buffer the command, the address, and the data, and thus the memory controller may interface with the memory dies 300 by driving only a load of the buffer die 200.

Further, the stacked memory device 70a may include a plurality of TSVs 220 passing through the layers.

The TSVs 220 may be disposed corresponding to the plurality of channels CH1 to CH8, and the TSVs 220 may include components for inputting and outputting 1024-bit data when each of the independent channels has a 128-bit bandwidth.

The TSVs 220 may be disposed to pass through the first to fourth memory dies 300a to 300d, and each of the first to fourth memory dies 300a to 300d may include a transmitter/a receiver connected to the TSVs 220. When a normal operation in which the inputting and outputting of the data is independently performed for each channel, only the transmitter/receiver of any one core die (i.e., one memory die) may be enabled, with respect to each of the TSVs 220, and thus each of the TSVs 220 may independently deliver only the data of any one memory die, or any channel, as an independent channel for that one memory die or channel.

The buffer die 200 may include an internal command generator ICG 210, the interface circuit 230, a TSV region TSVR 212, a physical region PHYR 213 and a direct access region DAR 214. The internal command generator 210 may generate an internal command based on the command CMD The TSV region 212 is a region in which TSVs 220 for communicating with the memory dies 300 are formed. Further, the physical region 213 is a region including a plurality of input-and-output (TO) circuits for communicating with an external memory controller, and various types of signals from the memory controller may be provided to the TSV region 212 through the physical region 213 and to the memory dies 300 through the TSVs 220.

The direct access region 214 may directly communicate with an external test device in a test mode for the stacked memory device 70a through a conductive means which is disposed on an outer surface of the stacked memory device 70a. Various types of signals provided from the tester may be provided to the memory dies 300 through the direct access region 214 and the TSV region 212. Alternatively, various types of signals provided from the test device may be provided to the memory dies 300 through the direct access region 214, the physical region 212, and the TSV region 212.

The interface circuit 230 may perform the above-mentioned operation.

Figure 6:
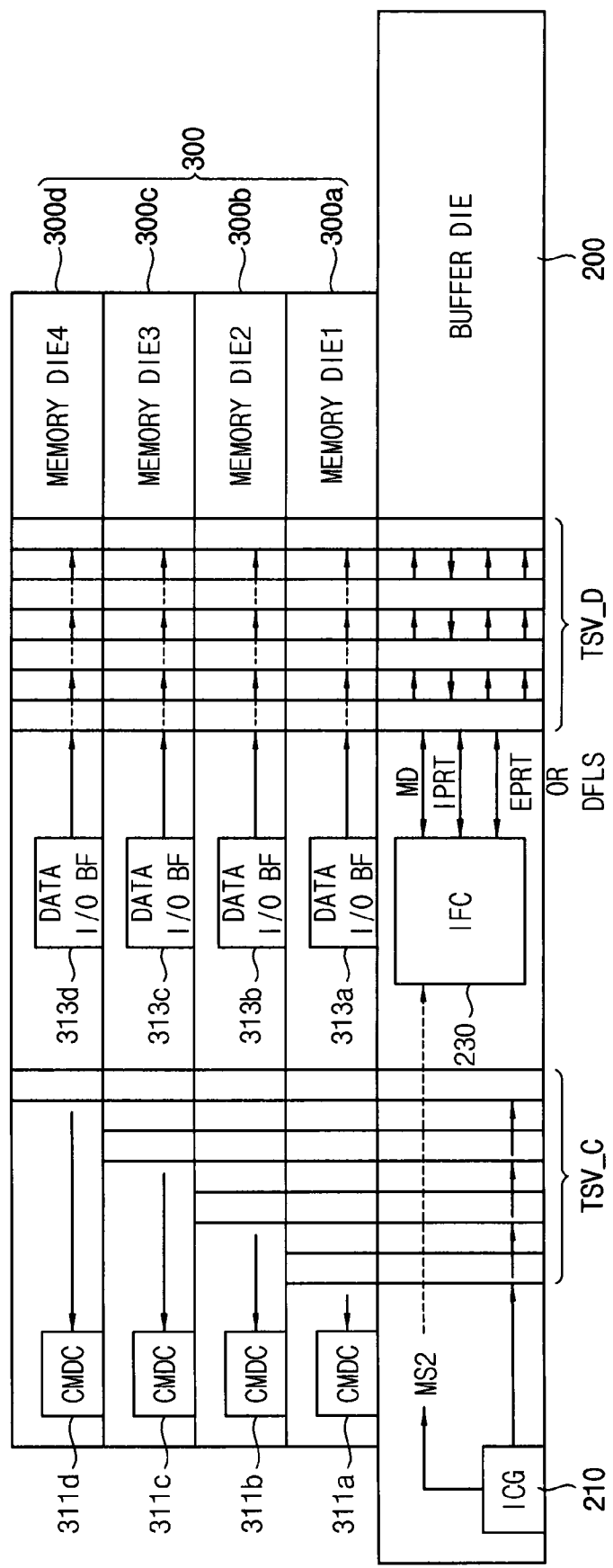
FIG. 6 illustrates operation of the interface circuit in the stacked memory device of FIG. 5.

FIG. 6 illustrates operation of the interface circuit in the stacked memory device of FIG. 5.

Referring to FIGS. 5 and 6, the stacked memory device 70a may include one or more memory dies 300 and the buffer die 200. The buffer die includes the internal command generator 210 and the interface circuit 230, and internal commands from the internal command generator 210 are provided to the memory dies 300 through command TSVs TSV_C which are independently formed for each channel. The internal command generator 210 may provide the interface circuit 230 with a mode signal MS2 designating one of the external ECC mode and the data mask mode based on the command CMD.

The interface circuit 230 may perform an ECC encoding operation on the main data MD based on the mode signal MS2 to generate internal parity IPRT, may store the external parity EPRT included in the sub data SDT in the second sub parity region in one of the memory dies 300, or may generate duplicated flag signals DFLs based on mask bits in the data mask signal DM included in the sub data SDT to store the duplicated flag signals DFLs in the in the second sub parity region. The interface circuit 230 may provide the main data MD, the internal parity IPRT and one of the external parity EPRT and the duplicated flag signals DFLs to a corresponding memory die through data TSVs TSV_D which are commonly formed for each channel The memory dies 300 may respectively include command decoders 311a to 311d which output internal control signals by decoding internal commands, and data input/output (I/O) buffer 313a to 313d which perform processing operation on read data or data to be written.

Referring to one of the memory dies 300 (for example, the first memory die 300a), the first memory die 300a may perform a memory operation according to a decoding result of command decoder 311a, and for example, data of a plurality of bits stored in a memory cell region inside the first memory die 300a may be read and provided to the data I/O buffer 313a. The data I/O buffer 313a may process the data of the plurality of bits in parallel, and output the data processed in parallel to a plurality of data TSVs TSV_D in parallel.

Figure 7:
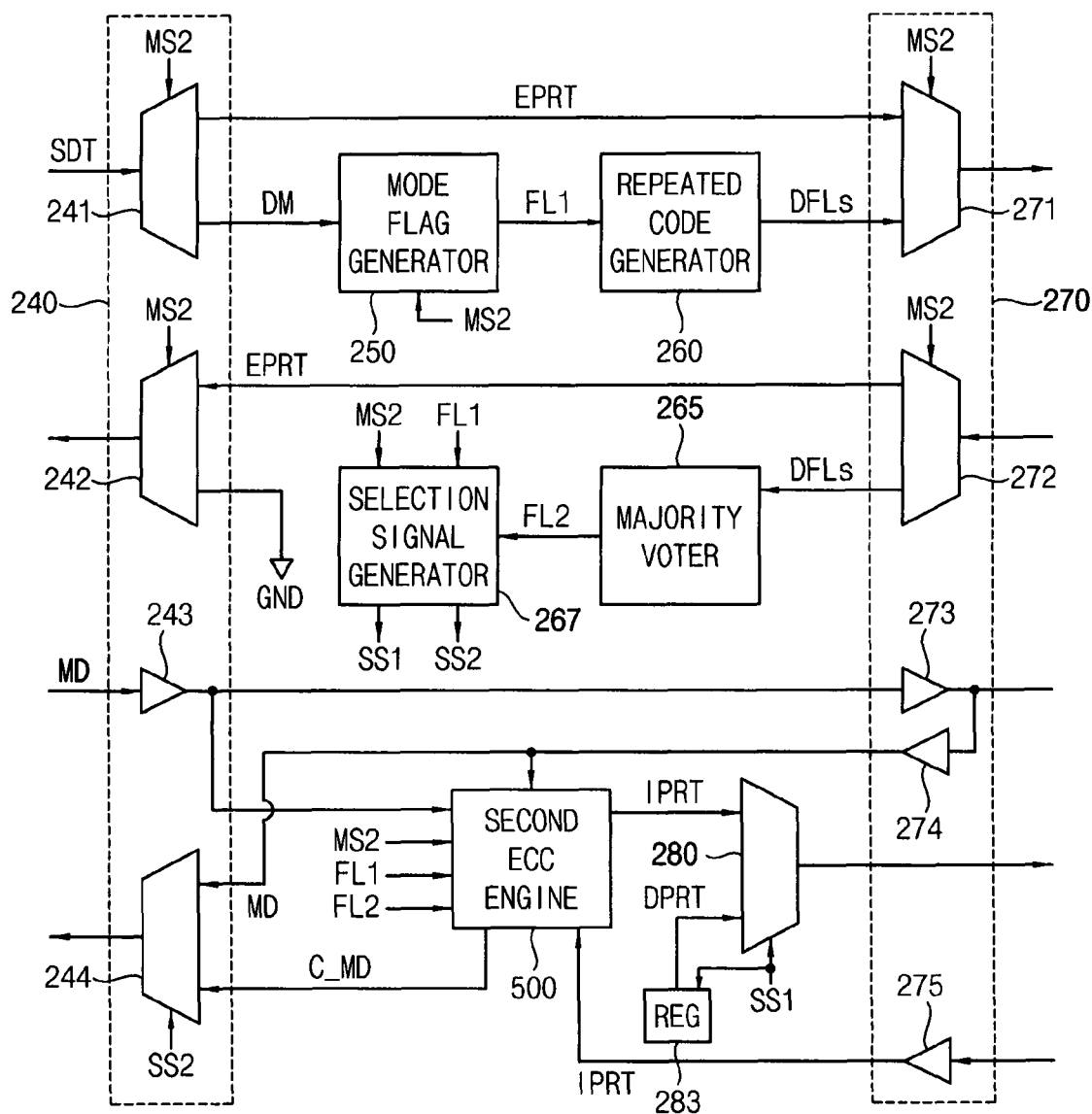
FIG. 7 is a block diagram illustrating an example of the interface circuit in FIG. 6 according to example embodiments.

FIG. 7 is a block diagram illustrating an example of the interface circuit in FIG. 6 according to example embodiments.

Referring to FIG. 7, the interface circuit 230 may include a first path control circuit 240, a second path control circuit 270, a mode flag generator 250, a repeated code generator 260, a majority voter 265, a selection signal generator 267, a second ECC engine 500, a selection circuit 280 and a register 283. The first path control circuit 240 communicates with the memory controller 20 and the second path control circuit 270 may be coupled to a portion of the TSVs 220

The first path control circuit 240 includes selection circuits 241, 242, and 244 and a buffer 243.

The selection circuit 241 receives the sub data SDT and outputs the sub data SDT as one of the external parity EPRT and the data mask signal DM in response to the second mode signal MS2. The selection circuit 241 provides the external parity EPRT to the second path control circuit 270 or provides the data mask signal DM to the mode flag generator 250. The selection circuit 242 receives the external parity EPRT and provides the external parity EPRT to the memory controller 20 in the external ECC mode in response to the second mode signal MS2. The buffer 243 provides the main data MD to the second ECC engine 500 and the second path control circuit 270. The selection circuit 244 receives the main data MD and a corrected main data C_MD and provides the memory controller 20 with one of the main data MD and the corrected main data C_MD in response to a selection signal SS2. For example, the selection circuit 244 outputs the main data MD received from the normal cell region in response to the selection signal SS2 having a first logic level (e.g., "0"). In this case, the main data MD received from the normal cell region is written in the masked write operation. The selection circuit 244 outputs the corrected main data C_MD corrected based on a result of an operation of the second ECC engine 500 in response to the selection signal SS2 having a second logic level (e.g., "1"). In this case, the corrected main data C_MD are generated based on the main data written in the external ECC mode or in the normal write operation of the data mask mode.

The mode flag generator 250 generates a first flag signal FL1 by performing logic operation on the mask bits in the data mask signal DM in response to the second mode signal MS2 and provides the first flag signal FL1 to the repeated code generator 260 and the selection signal generator 267. The mode flag generator 250 generates the first flag signal FL1 with a first logic level in response to at least one of the mask bits in the data mask signal DM having a first logic level (e.g., logic high level).

The repeated code generator 260 generates the duplicated flag signals DFLs by duplicating the first flag signal FL1. The repeated code generator 260 generates the duplicated flag signals DFLs by duplicating the first flag signal FL1 odd number of times. As an example, the repeated code generator 260 may generate the duplicated flag signals DFLs (1,1,1) or (1,1,1,1,1) when the first flag signal FL1 is "1." As another example, the repeated code generator 260 may generate the duplicated flag signals DFLs (0,0,0) or (0,0,0,0,0) when the first flag signal FL1 is "0."

The second path control circuit 270 includes selection circuits 271 and 272, and buffers 273, 274 and 275. As some examples, the selection circuit 271 receives the external parity EPRT and the duplicated flag signals DFLs, provides the external parity EPRT to the second sub parity region in response to the second mode signal MS2 designating the external ECC mode, and provides the duplicated flag signals DFLs to the second sub parity region in response to the second mode signal MS2 designating the data mask mode. As some examples, the selection circuit 271 receives the external parity EPRT and the first flag signal FL1, provides the external parity EPRT to the second sub parity region in response to the second mode signal MS2 designating the external ECC mode, and provides the first flag signal FL1 to the second sub parity region in response to the second mode signal MS2 designating the data mask mode. In this case, the repeated code generator 260 may be omitted.

In example embodiments, the main data and one of the external parity EPRT and the duplicated flag signals DFLs may be stored in the same page (i.e., a row of memory cells identified by the same row address and/or connected to the same word line) of the normal cell region and the second sub parity region, respectively.

In example embodiments, the main data and one of the external parity EPRT and the first flag signal FL1 may be stored in the same page (i.e., identified by the same row address) of the normal cell region and the second sub parity region, respectively.

As some examples, the selection circuit 272 receives the external parity EPRT or the duplicated flag signals DFLs from the memory cell array, provides the external parity EPRT to the selection circuit 242 in response to the second mode signal MS2 designating the external ECC mode and provides the duplicated flag signals DFLs to the majority voter 265 in response to the second mode signal MS2 designating the data mask mode. In some examples, the selection circuit 272 receives the external parity EPRT or the first flag signal FL1 from the memory cell array, provides the external parity EPRT to the selection circuit 242 in response to the second mode signal MS2 designating the external ECC mode and provides the first flag signal FL1 to the selection signal generator 267 in response to the second mode signal MS2 designating the data mask mode. In this case, the majority voter 265 may be omitted.

The buffer 273 receives the main data MD and provides the main data MD to the normal cell region, and the buffer 274 receives the main data MD read from the normal cell region and provides the main data MD to the second ECC engine 500 and the selection circuit 244. The buffer 275 receives the internal parity IPRT and provides the internal parity IPRT to the second ECC engine 500.

The majority voter 265 performs a majority voting operation on the duplicated flag signals DFLs from the memory cell array to output a second flag signal FL2 indicating a result of the majority voting. The majority voter 265 provides the second flag signal FL2 to the selection signal generator 267 and the second ECC engine 500. When the first flag signal FL1 has a first logic level, the second flag signal FL2 also has a first logic level, which indicates that a masked write operation is performed. When the first flag signal FL1 has a second logic level, the second flag signal FL2 also has a second logic level, which indicates that a normal write operation is performed. For example, when the duplicated flag signals DFLs has (1,1,1), (0,1,1), (1,0,1), or (1,1,0), the majority voter 265 generates the second flag signal FL2 as "1" after performing the majority voting operation on the duplicated flag signals DFLs having (1,1,1), (0,1,1), (1,0,1), or (1,1,0).

The selection signal generator 267 receives the first flag signal FL1, the second flag signal FL2, and the second mode signal MS2 and output selection signals SS1 and SS2. The selection signal generator 267 may receive the first flag signal FL1 and the second mode signal MS2 without the second flag signal FL2 if the duplicated flag signals DFLs are not generated. The selection signal generator 267 generates the signals SS1 and SS2, provides the selection signal SS1 to the selection circuit 280 and the register 283 and provides the selection signal SS2 to the selection circuit 244.

The second ECC engine 500 performs an ECC encoding operation on the main data MD to generate the internal parity IPRT in a write operation and performs an ECC decoding operation on the main data MD based on the internal parity IPRT to output the corrected main data C_MD in a read operation, based on the second mode signal MS2, the first flag signal FL1 and the second flag signal FL2. If the duplicated flag signals DFLs are not generated, the second ECC engine 500 may perform the ECC encoding operation and the ECC decoding operation based on the first flag signal FL1 and the second mode signal MS2 without the second flag signal FL2. The second ECC engine 500 performs the ECC encoding operation in response to the second mode signal MS2 designating the external ECC mode or the first flag signal FL1, which has a second logic level, designating the normal write operation. The second ECC engine 500 performs the ECC decoding operation in response to the second mode signal MS2 designating the external ECC mode or the first flag signal FL1, which has a second logic level, designating the normal write operation.

The register 283 stores default parity DPRT and provides the default parity to the selection circuit 280. The selection circuit 280 may provide one of the internal parity IPRT and the default parity DPRT to the first sub parity region in response to the selection signal SS1.

Figure 8:
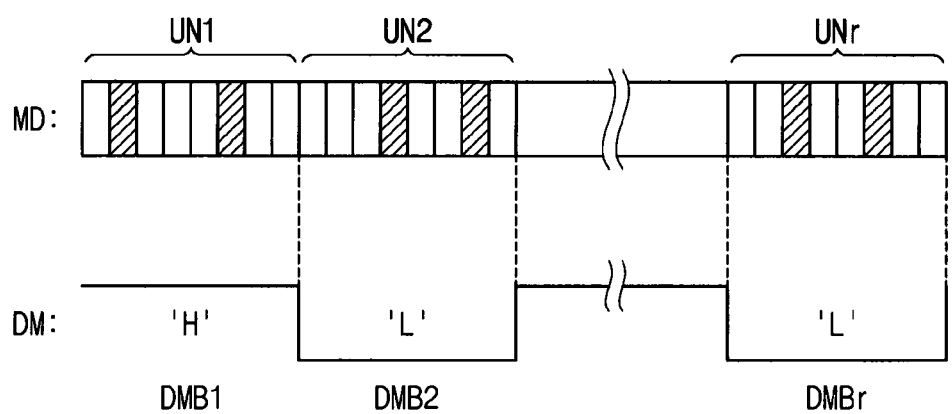
FIGS. 8 and 9 illustrate the main data and the data mask signal.
Figure 9:
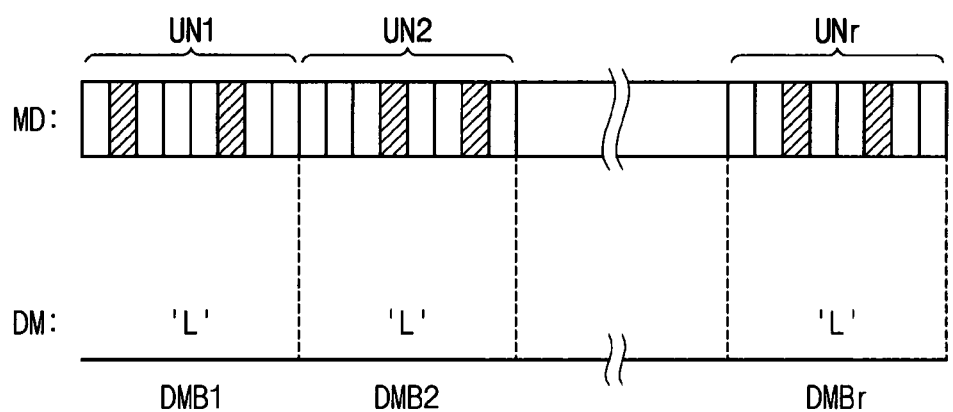

FIGS. 8 and 9 illustrate the main data and the data mask signal.

Referring to FIGS. 8 and 9, the main data MD includes a plurality of unit data UN1~UNr (r is a natural number greater than two) and each of the unit data UN1~UNr includes a plurality of data bits. The data mask signal DM includes a plurality of mask bits DMB1~DMBr corresponding to the unit data UN1~UNr. Each of the mask bits DMB1~DMBr may indicate whether to write corresponding one of the unit data UN1~UNr. A mask bit having a first logic level, of the mask bits DMB1~DMBr indicates that a corresponding unit data is masked.

As illustrated in FIG. 8, when at least one of the mask bits DMB1~DMBr has a first logic level (e.g., "1"), a masked write operation is performed on the main data MD. For example, the unit data UN1 may not be stored in the normal cell region in response to the mask bit DMB1 having "1," and the unit data UN2 and UNr may be stored in the normal cell region in response to the mask bits DMB2 and DMBr having "0," respectively. As illustrated in FIG. 9, if all of the mask bits DMB1~DMBr have a second logic level (e.g., "0"), a normal write operation is performed on the main data MD. For example, all of the unit data UN1~UNr may be stored in the normal cell region in response to the respective mask bits DMB1~DMBr each having "0."

In example embodiments, the first path control circuit 240 of the interface circuit 230 may sequentially receive the unit data UN1~UNr as the main data and the corresponding mask bits DMB1~DMBr as the sub data in serial, and may simultaneously output each of the unit data UN1~UNr and each of the corresponding mask bits DMB1~DMBr.

Figure 10:
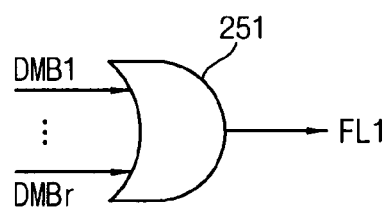
FIG. 10 illustrates an example of the mode flag generator in FIG. 7 according to example embodiments.

FIG. 10 illustrates an example of the mode flag generator in FIG. 7 according to example embodiments.

Referring to FIG. 10, the mode flag generator 250 may include an OR gate 251 and the OR gate 251 performs an OR operation on the mask bits DMB1~DMBr to output the first flag signal FL1.

Figure 11:
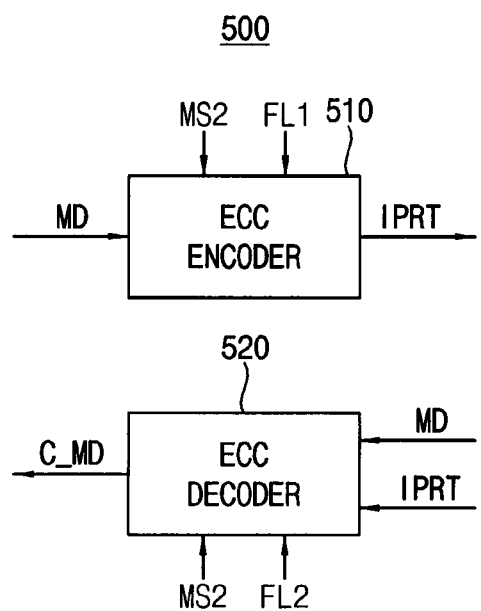
FIG. 11 is a block diagram illustrating the second ECC engine in FIG. 7 according to example embodiments.

FIG. 11 is a block diagram illustrating the second ECC engine in FIG. 7 according to example embodiments.

Referring to FIG. 11, the second ECC engine 500 may include an ECC encoder 510 and the ECC decoder 520.

The ECC encoder 510 is enabled when the second mode signal MS2 designates the external ECC mode or the first flag signal FL1, which has a second logic level, designates the normal write operation, and performs an ECC encoding operation on the main data MD to generate the internal parity IPRT.

The ECC decoder 520 is enabled when the second mode signal MS2 designates the external ECC mode or the second flag signal FL2, which has the second logic level, designates the normal write operation, and performs an ECC decoding operation on the main data MD based on the internal parity IPRT to output the corrected main data C_MD. In example embodiments, if the second flag signal FL2 is not generated the ECC decoder 520 is enabled when the second mode signal MS2 designates the external ECC mode or the first flag signal FL1, which has a second logic level, designates the normal write operation.

Figure 12:
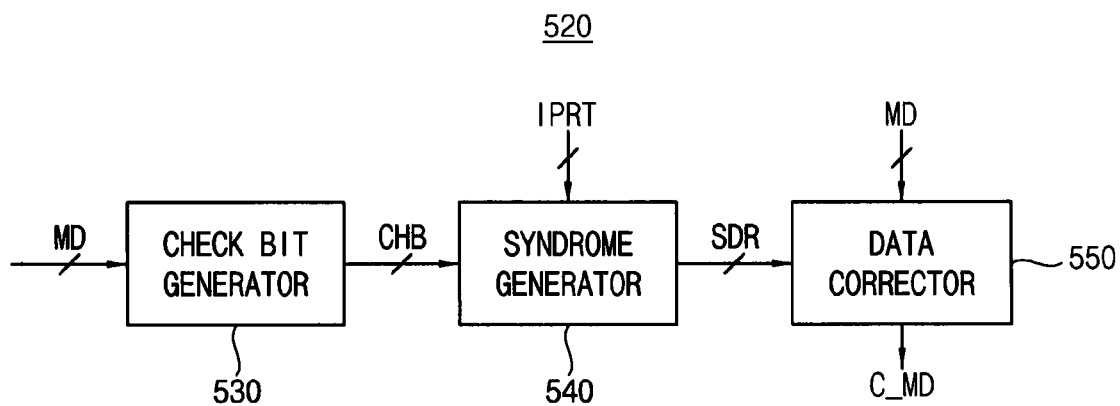
FIG. 12 illustrates an example of the ECC decoder in the second ECC engine of FIG. 11 according to example embodiments.

FIG. 12 illustrates an example of the ECC decoder in the second ECC engine of FIG. 11 according to example embodiments.

Referring to FIG. 12, the ECC decoder 520 may include a check bit generator 530 a syndrome generator 540 and a data corrector 550.

The check bit generator 530 generates check bits CHB by performing XOR operation in the main data MD read from the normal cell region. The syndrome generator 540 generates a syndrome data SDR by comparing corresponding bits of the internal parity IPRT and the check bits CHB. The data corrector 550 corrects an error bit in the main data MD based on logic level of each bit in the syndrome data SDR to output the corrected main data C_MD.

Figure 13:
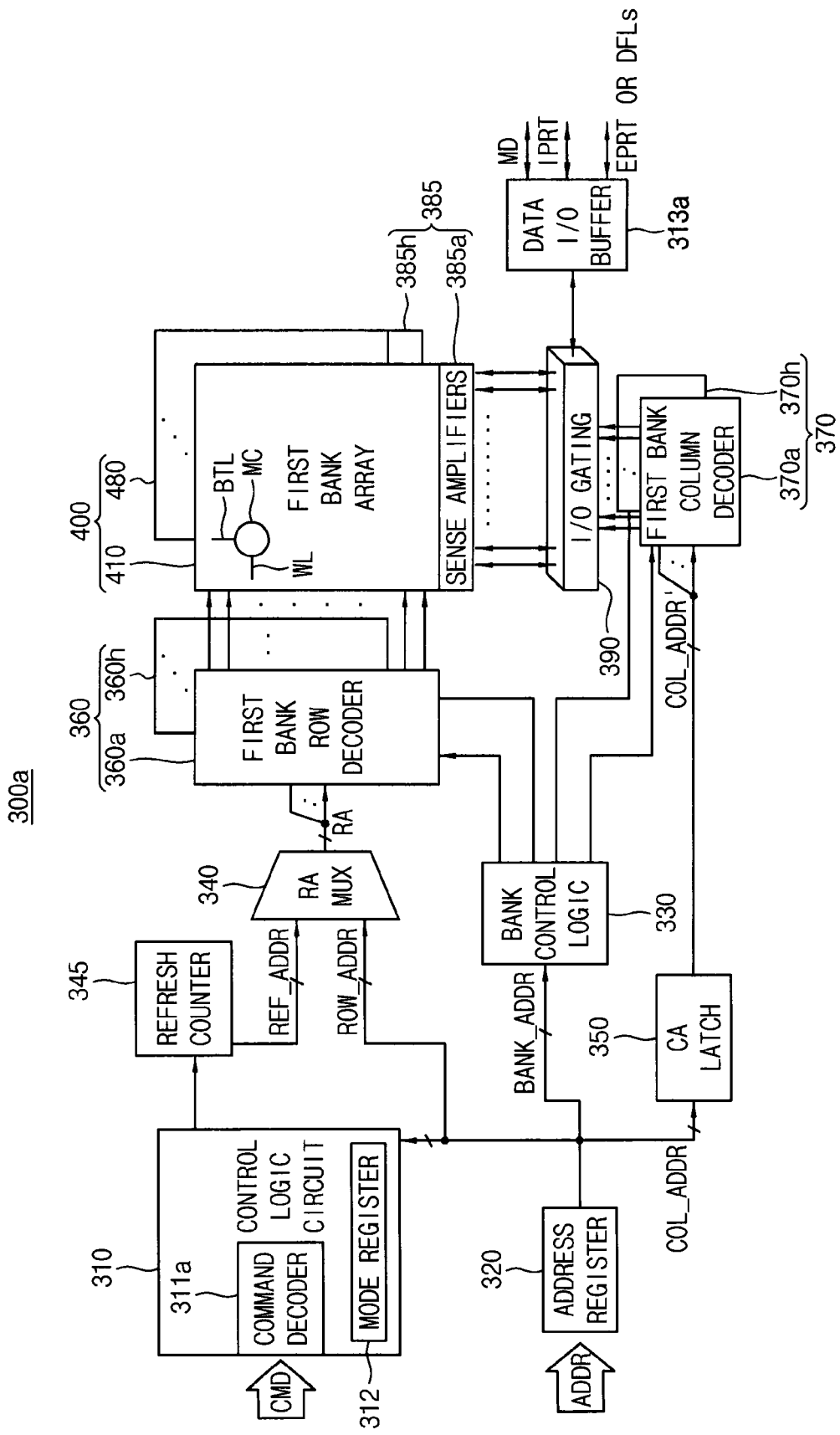
FIG. 13 is a block diagram illustrating one of the memory dies in the stacked memory device of FIG. 3 according to example embodiments.

FIG. 13 is a block diagram illustrating one of the memory dies in the stacked memory device of FIG. 3 according to example embodiments.

In FIG. 13, a configuration of the memory die 300a is illustrated and each configuration of the memory dies 300b~300k may be substantially the same as the configuration of the memory die 300a.

Referring to FIG. 13, the memory die 300a includes a control logic circuit 310, an address register 320, a bank control logic 330, a refresh counter 345, a row address multiplexer 340, a column address latch 350, a row decoder 360, a column decoder 370, the memory cell array 400, a sense amplifier unit 385, an I/O gating circuit 390, and a data I/O buffer 313a.

The memory cell array 400 includes first through eighth bank arrays 410~480. The row decoder 360 includes first through eighth bank row decoders 360a~360h respectively coupled to the first through eighth bank arrays 410~480, the column decoder 370 includes first through eighth bank column decoders 370a~370h respectively coupled to the first through eighth bank arrays 410~480, and the sense amplifier unit 385 includes first through eighth bank sense amplifiers 385a~385h respectively coupled to the first through eighth bank arrays 410~480.

The first through eighth bank arrays 410~480, the first through eighth bank row decoders 360a~360h, the first through eighth bank column decoders 370a~370h and first through eighth bank sense amplifiers 385a~385h may form first through eighth banks. Each of the first through eighth bank arrays 410~480 includes a plurality of memory cells MC formed at intersections of a plurality of word-lines WL and a plurality of bit-line BTL.

The address register 320 receives the address ADDR including a bank address BANK_ADDR, a row address ROW_ADDR and a column address COL_ADDR from an outside. The address register 320 provides the received bank address BANK_ADDR to the bank control logic 330, provides the received row address ROW_ADDR to the row address multiplexer 340, and provides the received column address COL_ADDR to the column address latch 350.

The bank control logic 330 generates bank control signals in response to the bank address BANK_ADDR. One of the first through eighth bank row decoders 360a~360h corresponding to the bank address BANK_ADDR is activated in response to the bank control signals, and one of the first through eighth bank column decoders 370a~370h corresponding to the bank address BANK_ADDR is activated in response to the bank control signals.

The row address multiplexer 340 receives the row address ROW_ADDR from the address register 320, and receives a refresh row address REF_ADDR from the refresh counter 345. The row address multiplexer 340 selectively outputs the row address ROW_ADDR or the refresh row address REF_ADDR as a row address RA. The row address RA that is output from the row address multiplexer 340 is applied to the first through eighth bank row decoders 360a~360h.

The refresh counter 345 may sequentially output the refresh row address REF_ADDR under control of the control logic circuit 310.

The activated one of the first through eighth bank row decoders 360a~360h, by the bank control logic 330, decodes the row address RA that is output from the row address multiplexer 340, and activates a word-line corresponding to the row address RA. For example, the activated bank row decoder applies a word-line driving voltage to the word-line corresponding to the row address.

The column address latch 350 receives the column address COL_ADDR from the address register 320, and temporarily stores the received column address COL_ADDR. In some embodiments, in a burst mode, the column address latch 350 generates column addresses COL_ADDR' that increment from the received column address COL_ADDR. The column address latch 350 applies the temporarily stored or generated column addresses COL_ADDR' to the first through eighth bank column decoders 370a~370h.

The activated one of the first through eighth bank column decoders 370a~370h activates a sense amplifier corresponding to the bank address BANK_ADDR and the column address COL_ADDR through the I/O gating circuit 390.

The I/O gating circuit 390 includes a circuitry for gating input/output data, and further includes input data mask logic, read data latches for storing data that is output from the first through eighth bank arrays 410~480, and write drivers for writing data to the first through eighth bank arrays 410~480.

Data (including the main data, internal parity and external parity or including the main data and duplicated flag signals) read from one bank array of the first through eighth bank arrays 410~480 is sensed by a sense amplifier coupled to the one bank array from which the data is to be read, and is stored in the read data latches. The data stored in the read data latches may be provided to the outside or another memory die through the data I/O buffer 313a.

The data to be written in one bank array of the first through eighth bank arrays 410~480 may be provided to the I/O gating circuit 390 and the I/O gating circuit 390 may write the data in one bank array through the write drivers.

The data I/O buffer 313a may store the main data MD and one of a set of the internal parity IPRT and the external parity EPRT and the duplicated flag signals DFLs in the memory cell array 400 through the I/O gating circuit 390 in a write operation and may provide the main data MD and one of a set of the internal parity IPRT and the external parity EPRT and the duplicated flag signals DFLs to the interface circuit 230 through the I/O gating circuit 390 in a read operation.

The control logic circuit 310 may control operations of the memory die 300a. For example, the control logic circuit 310 may generate control signals for the memory die 300a in order to perform a write operation or a read operation. The control logic circuit 310 includes a command decoder 311a that decodes the command CMD received from the internal command generator 210 and a mode register 312 that sets an operation mode of the memory die 300a.

Figure 14:
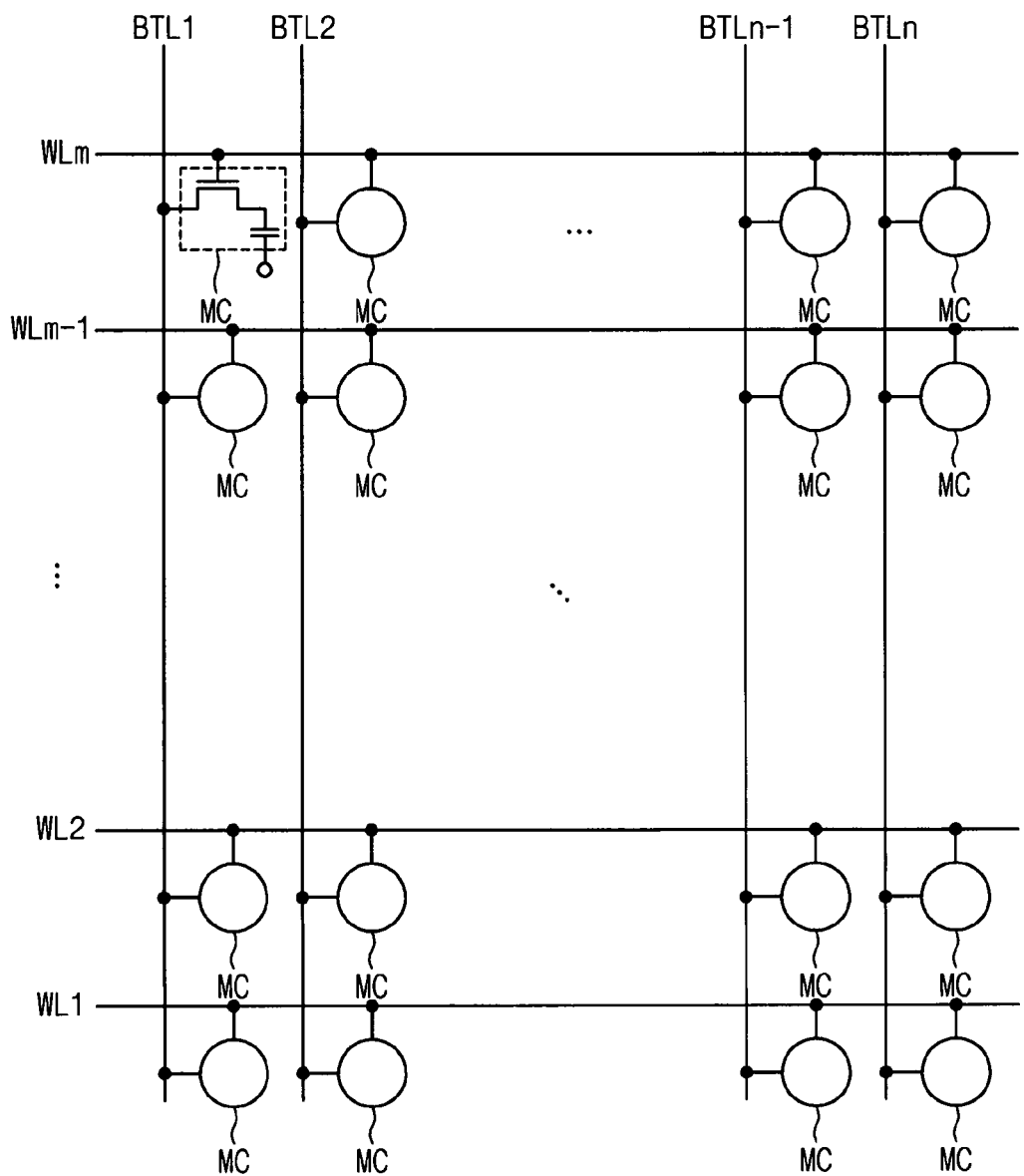
FIG. 14 illustrates an example of the first bank array in the memory die of FIG. 13.

FIG. 14 illustrates an example of the first bank array in the memory die of FIG. 13.

Referring to FIG. 14, the first bank array 410 includes a plurality of word-lines WL1~WLm (m is a natural number greater than two), a plurality of bit-lines BTL1~BTLn (n is a natural number greater than two), and a plurality of dynamic memory cells MCs disposed at intersections between the word-lines WL1~WLm and the bit-lines BTL1~BTLn. Each of the dynamic memory cells MCs includes a cell transistor coupled to each of the word-lines WL1~WLm and each of the bit-lines BTL1~BTLn and a cell capacitor coupled to the cell transistor. The first bank array 410 may include a normal cell region to store the main data MD, a first sub parity region to store the internal parity IPRT and a second sub parity region to store one of the external parity EPRT and the duplicated flag signals DFLs.

In FIGS. 13 and 14, it is illustrated as the memory die 300a is implemented with DRAM including dynamic memory cells. In example embodiments, each of the memory dies 300a~300k may be implemented with a resistive memory device including resistive memory cells or other memory device.

Figure 15:
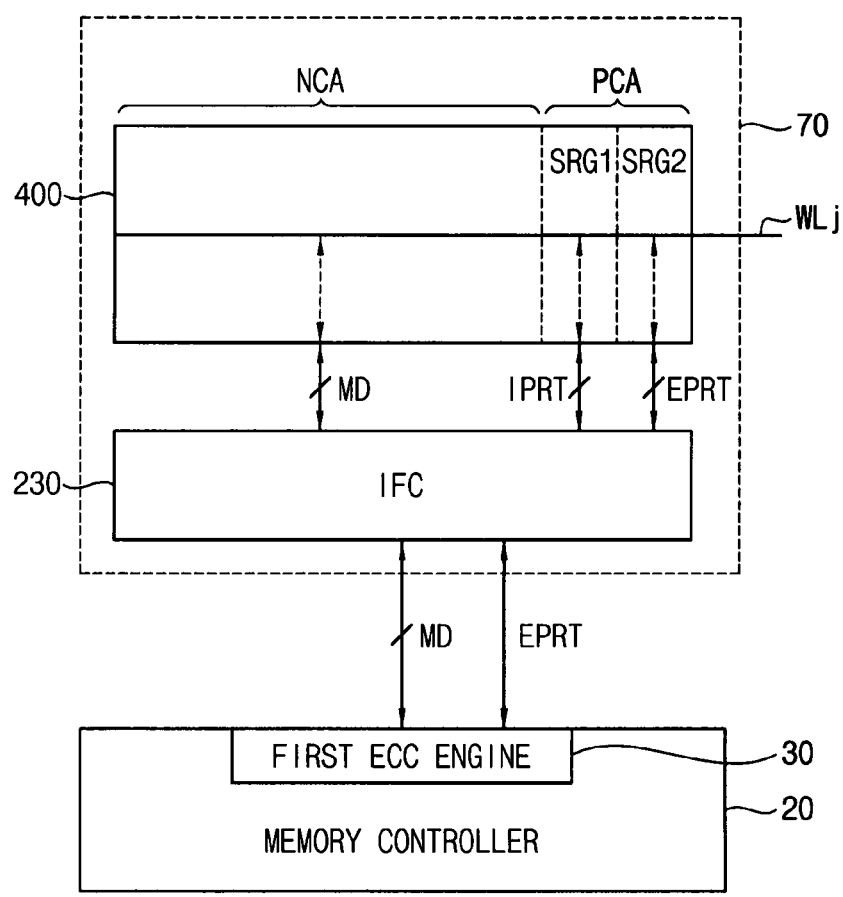
FIGS. 15 through 17 illustrate that data is exchanged between the memory controller and the stacked memory device in the memory system of FIG. 1, respectively.
Figure 16:
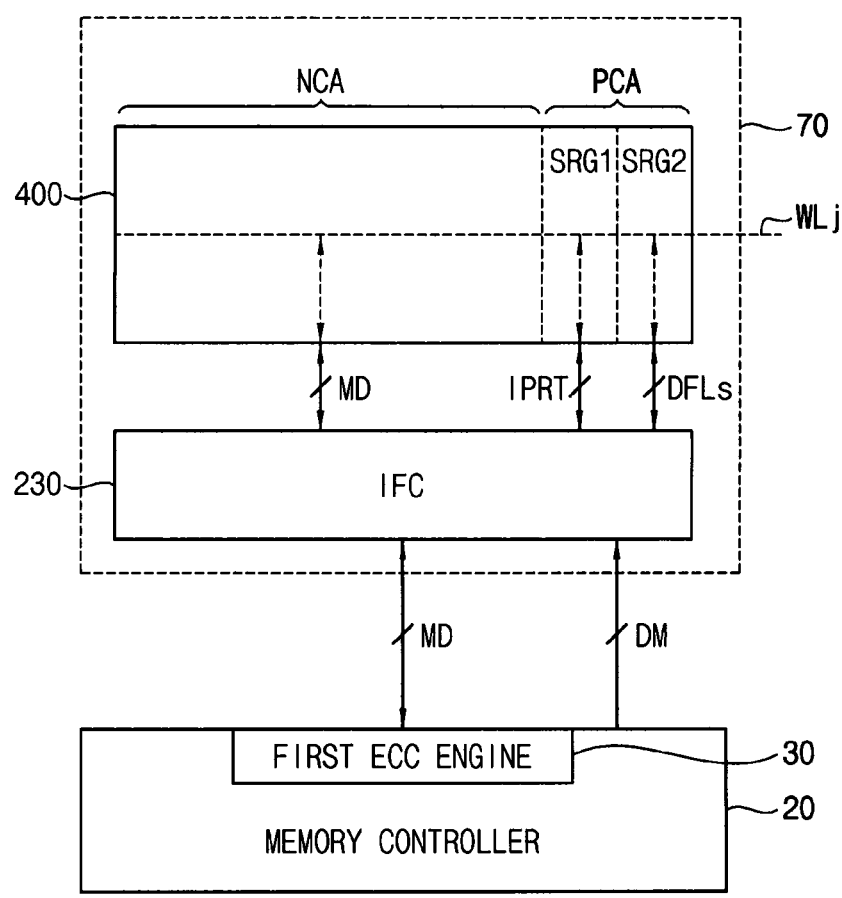
Figure 17:
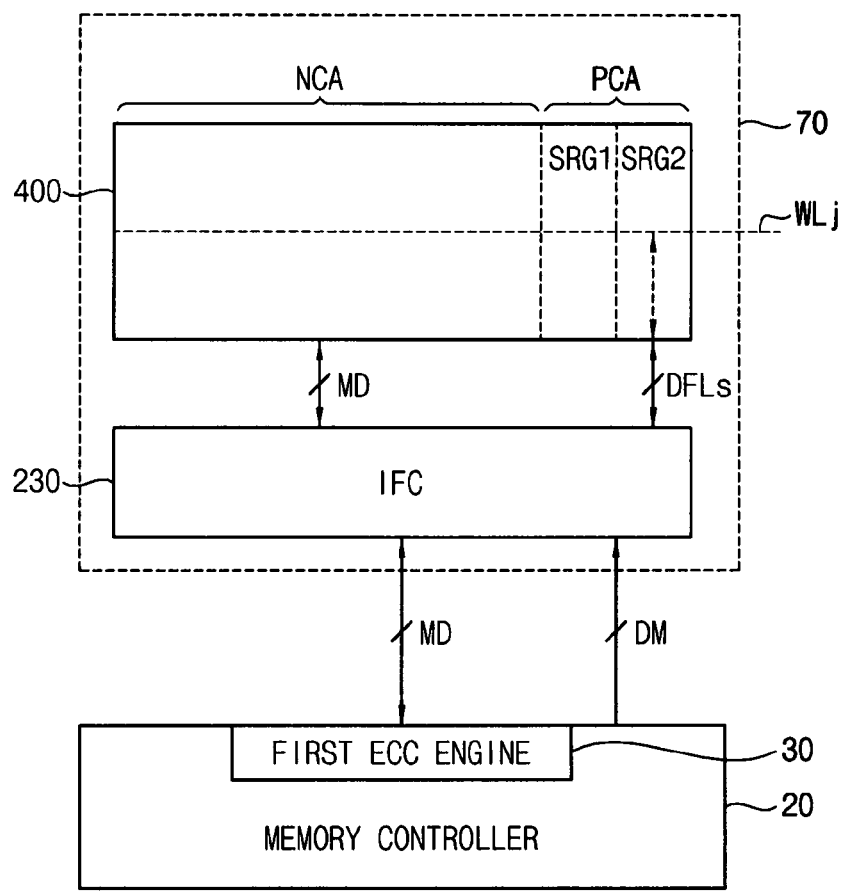

FIGS. 15 through 17 illustrate that data is exchanged between the memory controller and the stacked memory device in the memory system of FIG. 1, respectively.

Referring to FIGS. 15 through 17, the memory cell array 400 includes a normal cell region NCA and a parity cell region PCA and the parity cell region PCA includes a first sub parity region SRG1 and a second sub parity region SRG2.

FIG. 15 illustrates that the data is exchanged in the external ECC mode.

Referring to FIG. 15, if the command CMD designates the external ECC mode, the main data MD and the external parity EPRT are exchanged between the interface circuit 230 and the first ECC engine 30, and the interface circuit 230 generates the internal parity IPRT based on the main data MD and stores the main data MD, the internal parity IPRT and the external parity EPRT in the same page (e.g., a group of memory cells designated by the same row address) of the normal cell region NCA, the first sub parity region SRG1 and the second sub parity region SRG2, coupled to a word-line WLj, respectively. For example, a plurality of memory cells connected to the word-line WLj may constitute one page or several pages.

FIG. 16 illustrates that the data is exchanged in the normal write operation in the data mask mode.

Referring to FIG. 16, if the command CMD designates the data mask mode and all of the mask bits of the data mask signal DM have a second logic level, the main data MD is exchanged between the interface circuit 230 and the first ECC engine 30, and the memory controller 20 provides the data mask signal DM to the interface circuit 230. The interface circuit 230 generates the internal parity IPRT based on the main data MD, generates the duplicated flag signals DFLs based on the data mask signal DM and stores the main data MD, the internal parity IPRT and the duplicated flag signals DFLs in the same page of the normal cell region NCA, the first sub parity region SRG1 and the second sub parity region SRG2, coupled to the word-line WLj, respectively.

FIG. 17 illustrates that the data is exchanged in the masked write operation in the data mask mode.

Referring to FIG. 17, if the command CMD designates the data mask mode and at least one of the mask bits of the data mask signal DM have a first logic level, the main data MD is exchanged between the interface circuit 230 and the first ECC engine 30, and the memory controller 20 provides the data mask signal DM to the interface circuit 230. In this case, a number of bits of the main data MD in FIG. 17 may be less than a number of bits of the main data MD in FIG. 15 or FIG. 16. The interface circuit 230 generates the duplicated flag signals DFLs based on the data mask signal DM and stores the main data MD and the duplicated flag signals DFLs in the same page of the normal cell region NCA and the second sub parity region SRG2, coupled to the word-line WLj, respectively. In FIG. 17, the second ECC engine 500 in the interface circuit 230 is disabled.

Figure 18:
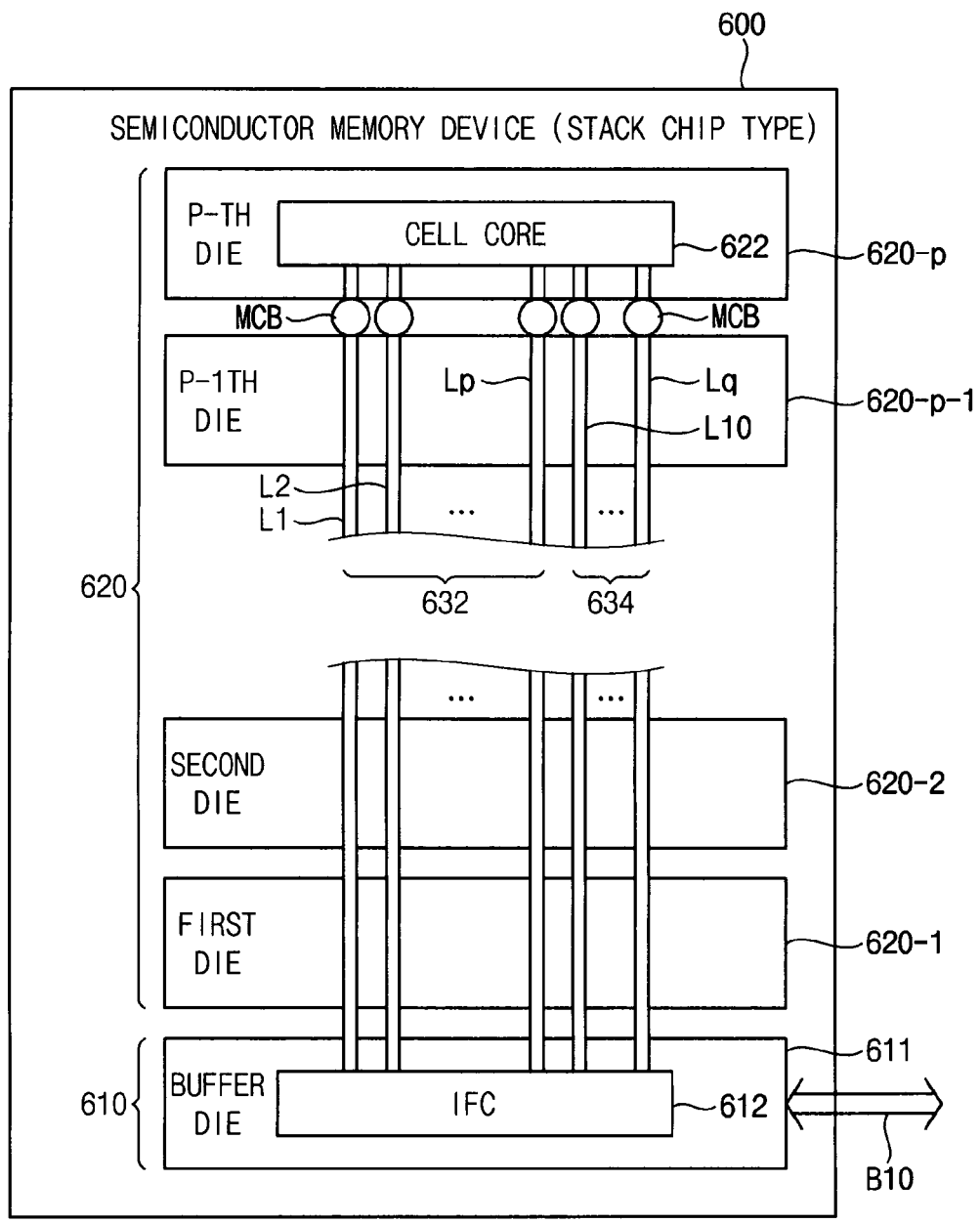
FIG. 18 is a block diagram illustrating a semiconductor memory device according to example embodiments.

FIG. 18 is a block diagram illustrating a semiconductor memory device according to example embodiments.

Referring to FIG. 18, a semiconductor memory device 600 may include a first group of dies 610 and a second group of dies 620 providing a stacked chip structure.

The first group of dies 610 may include at least one buffer die 611. The second group of dies 620 may include a plurality of memory dies 620-1 to 620-p which is stacked on the first group of dies 610 and conveys data through a plurality of through substrate via (e.g., through silicon via (TSV)) lines.

Each of the memory dies 620-1 to 620-p may include a cell core 622 to store data and parity. The cell core 622 may include a normal cell region to store main data, a first sub parity region to store internal parity and a second sub parity region to store one of external parity and duplicated flag signals. For example, the parity may include the internal parity, the external parity and the duplicated flag signals.

The first group of dies 610 may include the buffer die 611 or a logic die. The buffer die 611 may include an interface circuit 612 and the interface circuit 612 may perform an ECC encoding operation and an ECC decoding operation based on a command or a write operation designated by a data mask signal to support various specifications.

The semiconductor memory device 600 may be a stack chip type memory device or a stacked memory device which conveys data and control signals through the TSV lines. The TSV lines may be also called 'through electrodes'.

With the above description, a data TSV line group 632 which is formed at one memory die 620-p may include a plurality of TSV lines L1 to Lp, and a parity TSV line group 634 may include a plurality of TSV lines L10 to Lq. The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor.

The semiconductor memory device 600 may have a three-dimensional (3D) chip structure or a 2.5D chip structure to communicate with the host through a data bus B10. The buffer die 611 may be connected with the memory controller through the data bus B10.

Figure 19:
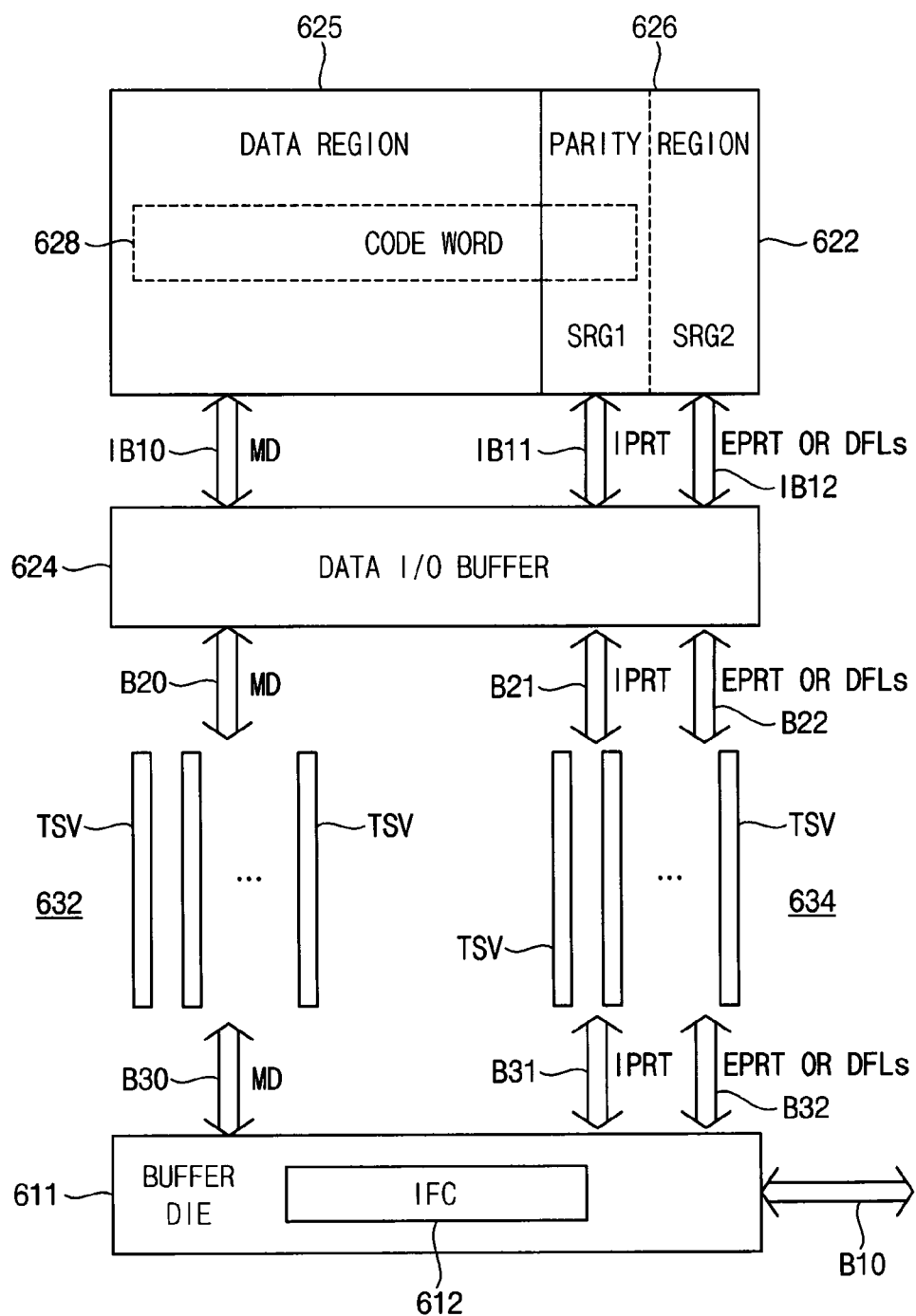
FIG. 19 is a diagram schematically illustrating connections between the interface circuit and the cell core in the semiconductor memory device of FIG. 18 according to example embodiments.

FIG. 19 is a diagram schematically illustrating connections between the interface circuit and the cell core in the semiconductor memory device of FIG. 18 according to example embodiments.

Referring to FIG. 19, the cell core 622 and the interface circuit 612 may be connected through a data TSV line group 632 and a parity TSV line group 634.

More particularly, the cell core 622 may include a memory cell array, and the memory cell array may include a data region (i.e., a normal cell region) 625 to store the main data MD and a parity region (i.e., a parity cell region) 626 to store the parity. The parity cell region 626 includes the first sub parity region SRG1 and the second sub parity region SRG2. As mentioned above, the first sub parity region SRG1 stores the internal parity IPRT generated by the interface circuit 612, the second sub parity region SRG2 stores the external parity EPRT or the duplicated flag signals DFLs and the data cell region 625 stores the main data MD.

In the case of reading data, a code word 628 may be read from the cell core 622. The code word 628 may include main data MD from the data region 625 and the internal parity data IPRT from the parity region 626. To the data I/O buffer 624, the cell core 622 may output the main data MD through an internal data bus IB10, the internal parity data IPRT through an internal parity bus IB11 and the external parity EPRT or the duplicated flag signals DFLs through an internal parity bus IB12. The data I/O buffer 624 may output the main data MD as transmission data through a data bus B20, and transmission parity data through parity buses B21 and B22. The transmission parity data may include the internal parity IPRT and the external parity EPRT. The data I/O buffer 624 may output the duplicated flag signals DFLs through the parity bus B22.

In the case of writing data, the code word 628 may be written to the cell core 622. The code word 628 may include main data MD stored in the data region 625 and the internal parity data IPRT stored in the parity region 626. From the data I/O buffer 624, the cell core 622 may receive the main data MD through the internal data bus IB10, the internal parity data IPRT through the internal parity bus IB11 and the external parity EPRT or the duplicated flag signals DFLs through the internal parity bus IB12. The data I/O buffer 624 may receive the main data MD as transmission data through the data bus B20, and transmission parity data through the parity buses B21 and B22. The data I/O buffer 624 may receive the duplicated flag signals DFLs through the parity bus B22.

Figure 20:
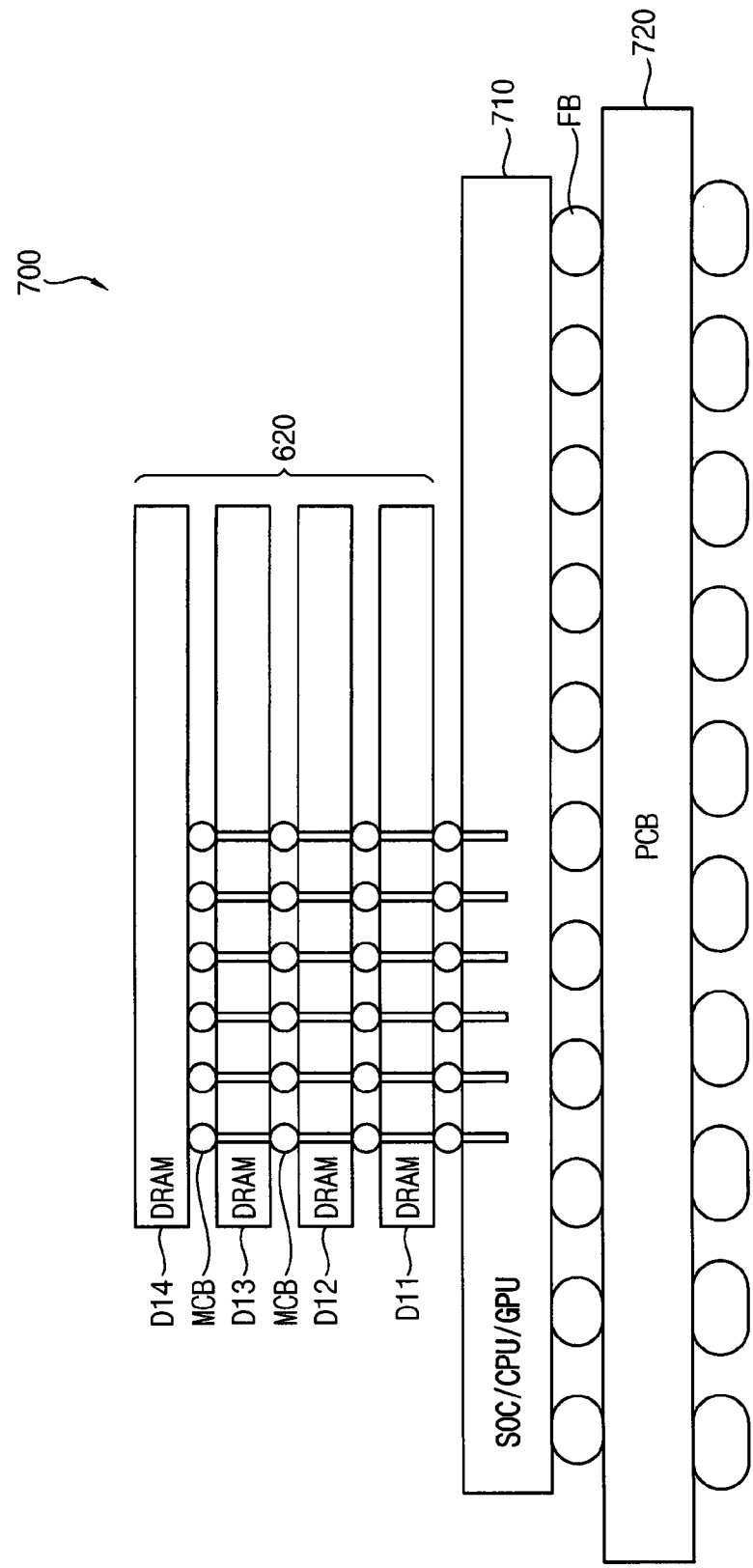
FIG. 20 is a cross-sectional view of a 3D chip structure employing the semiconductor memory device of FIG. 18 according to example embodiments.

FIG. 20 is a cross-sectional view of a 3D chip structure employing the semiconductor memory device of FIG. 18 according to example embodiments.

FIG. 20 shows a 3D chip structure 700 in which a host and a HBM are directly connected without an interposer layer (e.g., a buffer die or a memory controller).

Referring to FIG. 20, a host die 710 such as a system-on-chip (SoC), a central processing unit (CPU), or a graphic processing unit (GPU) may be disposed on a printed circuit board (PCB) 720 using flip chip bumps FB. Memory dies D11 to D14 may be stacked on the host die 710 to implement a HBM structure such as the memory dies 620. In FIG. 20, the buffer die 611 or the logic die of FIG. 18 is omitted. However, the buffer die 611 or the logic die may be disposed between the memory die D11 and the host die 710. To implement the HBM, TSV lines may be formed at the memory dies D11 to D14. The TSV lines may be electrically connected with micro bumps MCB placed between memory dies.

Figure 21:
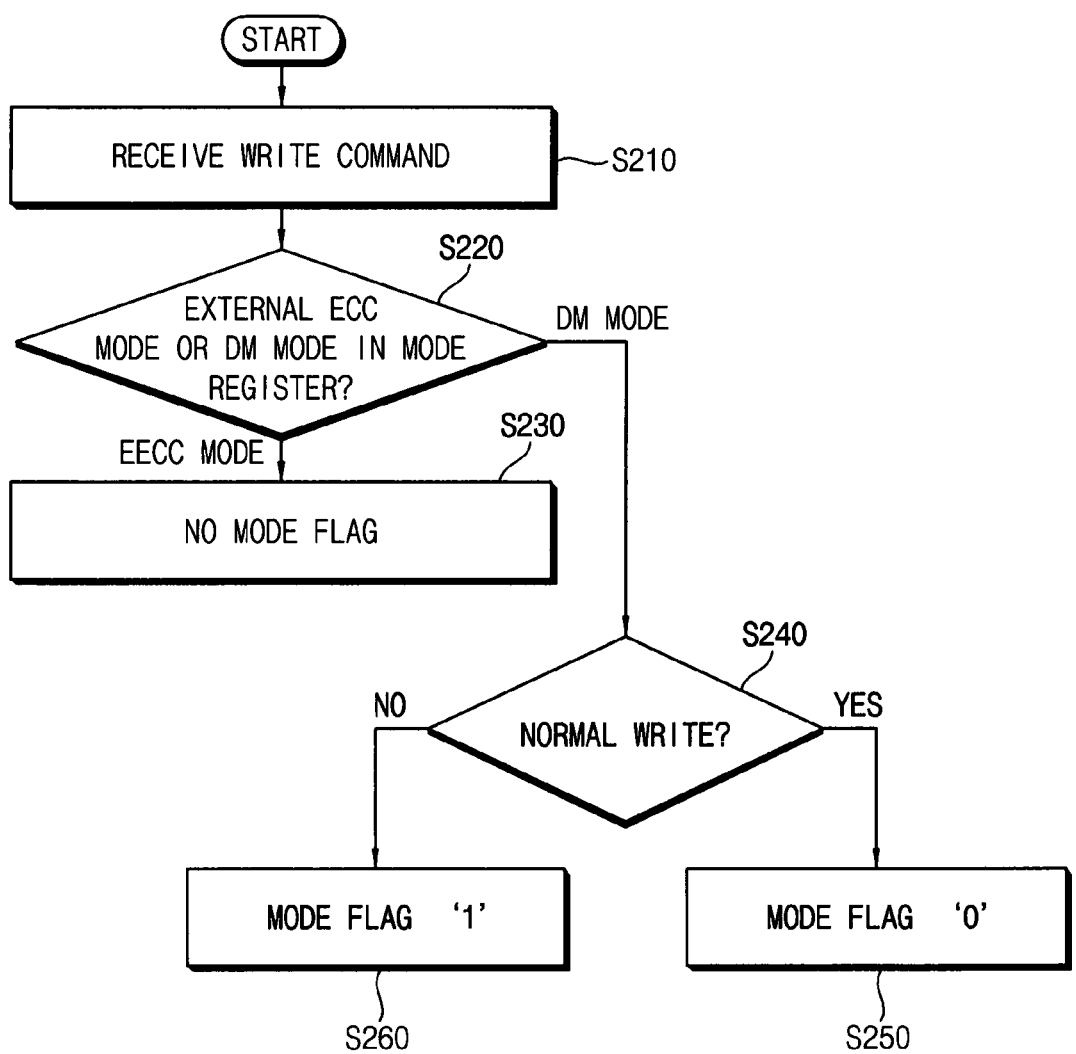
FIG. 21 is a flow chart illustrating a method of operating a semiconductor memory device according to example embodiments.

FIG. 21 is a flow chart illustrating a method of operating a semiconductor memory device according to example embodiments.

FIG. 21 illustrates a write operation performed in the semiconductor memory device.

Referring to FIGS. 1, 5 through 19 and 21, the semiconductor memory device 70 includes a buffer die to communicate with an external device, a plurality of memory dies stacked on the buffer die, a plurality of through substrate vias (TSVs) extending through the plurality of memory dies to connect to the buffer die, each of plurality of memory dies includes the memory cell array, and the memory cell array includes a normal cell region and a parity cell region that includes a first sub parity region and a second sub parity region. According to the method, the semiconductor memory device 70 receives a write command CMD from a memory controller (the external device) 20 in an operation S210. An internal command generator 210 in the buffer die 200 determines whether a mode register set command in the write command CMD designates an external ECC mode or a data mask mode in an operation S220 and provides an interface circuit 230 with a second mode signal MS2 indicating the designated mode.

When the second mode signal MS2 designates the external ECC mode (EECC Mode), the interface circuit 230 does not generate the first flag signal FL1 shown in FIG. 7 in an operation S230.

When the second mode signal MS2 designates the data mask mode (DM Mode), the interface circuit 230 determines whether mask bits in data mask signal DM designates a normal write operation in an operation S240. If the mask bits in data mask signal DM designates the normal write operation (YES in the operation S240), a mode flag generator 250 generates the first flag signal FL1 with a second logic level in an operation S250. When the mask bits in data mask signal DM designates a masked write operation (NO in the operation S240), the mode flag generator 250 generates the first flag signal FL1 with a first logic level in an operation S260.

Figure 22:
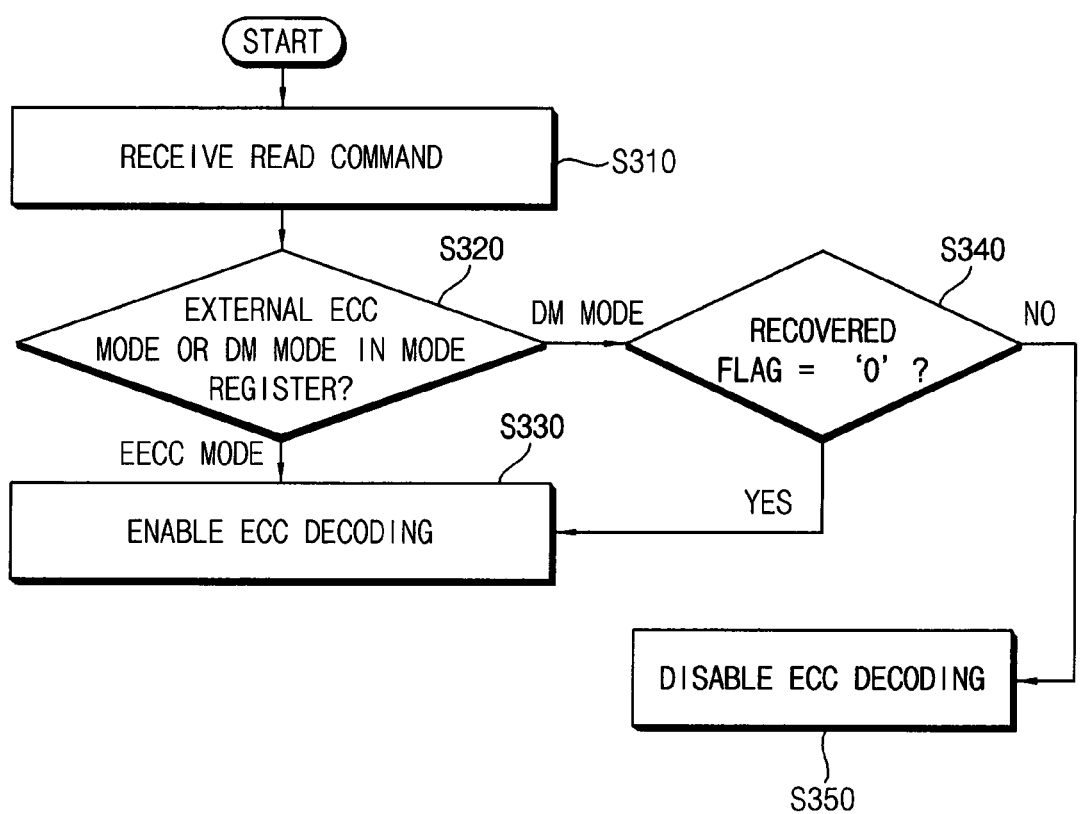
FIG. 22 is a flow chart illustrating a method of operating a semiconductor memory device according to example embodiments.

FIG. 22 is a flow chart illustrating a method of operating a semiconductor memory device according to example embodiments.

FIG. 22 illustrates a read operation performed in the semiconductor memory device.

Referring to FIGS. 1, 5 through 19 and 22, the semiconductor memory device 70 includes a buffer die to communicate with an external device, a plurality of memory dies stacked on the buffer die, a plurality of through substrate vias (TSVs) extending through the plurality of memory dies to connect to the buffer die, each of plurality of memory dies includes the memory cell array, and the memory cell array includes a normal cell region and a parity cell region that includes a first sub parity region and a second sub parity region. According to the method, the semiconductor memory device 70 receives a read command CMD from the memory controller 20 in an operation S310. The internal command generator 210 in the buffer die determines whether the mode register set command in the write command CMD designates the external ECC mode or the data mask mode in an operation S320 and provides the interface circuit 230 with the second mode signal MS2 indicating the designated mode.

When the second mode signal MS2 designates the external ECC mode (EECC Mode), the interface circuit 230 enables a second ECC engine 500 to perform an ECC decoding operation on the main data MD in an operation S330. When the second mode signal MS2 designates the data mask mode (DM Mode), the majority voter 265 in the interface circuit 230 performs majority voting on the duplicated flag signals DFLs to generate the second flag signal FL2, and provides the second flag signal FL2 to the ECC decoder 520. The ECC decoder 520 determines whether the second flag signal FL2 has a second logic level in an operation S340.

When the second flag signal FL2 has a second logic level, (YES in the operation S340), which indicates that a normal write operation is performed, the ECC decoder 520 is enabled to perform an ECC decoding operation on the main data MD in the operation S330. When the second flag signal FL2 has a first logic level, (NO in the operation S340), which indicates that a masked normal write operation is performed, the ECC decoder 520 is disabled in an operation S350.

Figure 23:
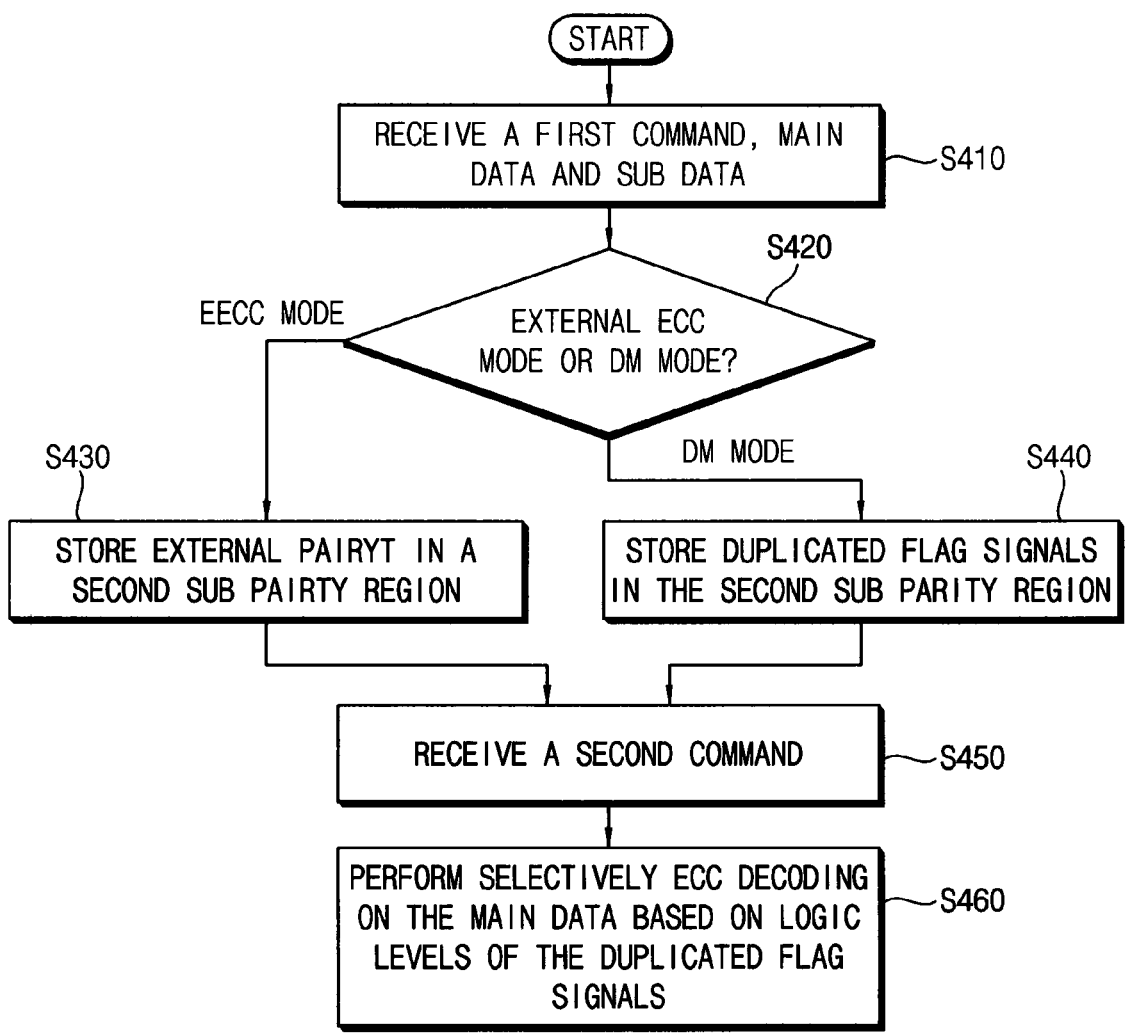
FIG. 23 is a flow chart illustrating a method of operating a semiconductor memory device according to example embodiments.

FIG. 23 is a flow chart illustrating a method of operating a semiconductor memory device according to example embodiments.

Referring to FIGS. 1, 5 through 19 and 23, the semiconductor memory device 70 includes a buffer die to communicate with an external device, a plurality of memory dies stacked on the buffer die, a plurality of through substrate vias (TSVs) extending through the plurality of memory dies to connect to the buffer die, each of plurality of memory dies includes the memory cell array, and the memory cell array includes a normal cell region and a parity cell region that includes a first sub parity region and a second sub parity region. According to the method, the semiconductor memory device 70 receives a first command CMD, main data MD and sub data SDT from the memory controller 20 in an operation S410. The first command may be a write command. The internal command generator 210 in the buffer die determines whether a mode register set command in the write command CMD designates an external ECC mode or a data mask mode in an operation S420 and provides the interface circuit 230 with the second mode signal MS2 indicating the designated mode.

When the second mode signal MS2 designates the external ECC mode (EECC Mode), the interface circuit 230 stores external parity of the sub data SDT in the second sub parity region in one of the memory dies in an operation S430. When the second mode signal MS2 designates the data mask mode (DM Mode), the interface circuit 230 generates duplicated flag signals DFLs or a first flag signal FL1 based on a data mask signal DM of the sub data SDT to store the duplicated flag signals DFLs or the first flag signal FL1 in the second sub parity region in an operation S440. For example, the external parity, the duplicated flag signals DFLs, and the first flag signal FL1 may be stored in the same page of the memory cell array.

The buffer die 200 receives a second command from the memory controller 20 in an operation S450. The second command may be a read command. The interface circuit 230 performs an ECC decoding operation on the main data MD read from the normal cell region, based on logic levels of the duplicated flag signals DFLs read from the second sub parity region in an operation S460.

Figure 24:
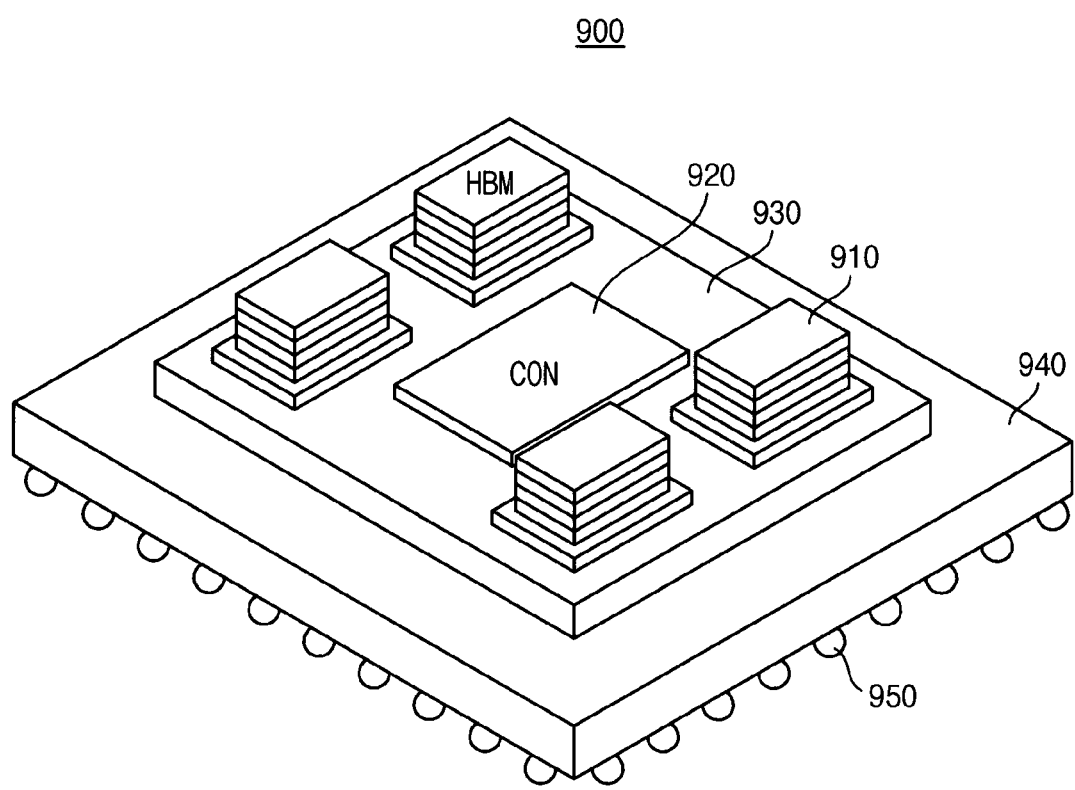
FIG. 24 is a diagram illustrating a semiconductor package including the stacked memory device according to example embodiments.

FIG. 24 is a diagram illustrating a semiconductor package including the stacked memory device according to example embodiments.

Referring to FIG. 24, a semiconductor package 900 may include one or more stacked memory devices 910 and a memory controller 920.

The stacked memory devices 910 and the memory controller 920 may be mounted on an interposer 930, and the interposer on which the stacked memory devices 910 and the memory controller 920 are mounted may be mounted on a package substrate 940.

In example embodiments, one of the stacked memory devices 910 may employ the stacked memory device 70 in FIG. 1 and the memory controller 920 may employ the memory controller 20 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies. The buffer die may include the interface circuit, each of the memory dies include the memory cell array, and the memory cell array includes the normal cell region, the first sub parity region and the second sub parity region. The interface circuit may perform an ECC encoding operation and ECC decoding operation based on operation mode selectable by a command.

The plurality of stacked memory devices 910 may be mounted on the interposer 930, and the memory controller 920 may communicate with the plurality of stacked memory devices 910. For example, each of the stacked memory devices 910 and the memory controller 920 may include a physical region, and communication may be performed between the stacked memory devices 910 and the memory controller 920 through the physical regions. Meanwhile, when each of the stacked memory devices 910 includes a direct access region, a test signal may be provided to each of the stacked memory devices 910 through conductive means (e.g., solder balls 950) mounted under package substrate 940 and the direct access region.

Here, the interposer 930 may include an embedded multi-die interconnect bridge (EMIB) which is an organic or non-TSV manner having a TSV form or a printed circuit board (PCB) form.

Aspects of the present inventive concept may be applied to various systems that employ stacked memory devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device comprising:
   a first memory die including a memory cell array including a plurality of memory cells coupled to a plurality of word-lines and a plurality of bit-lines, wherein the memory cell array includes a normal cell region and a parity cell region that includes a first sub parity region and a second sub parity region; and
   an interface circuit including an error correction code (ECC) engine, and the interface circuit configured to:
   receive main data and sub data from an external device, the sub data comprising external parity or a data mask signal;
   generate a first flag signal based on mask bits of the data mask signal;
   perform an ECC encoding operation on the main data to generate internal parity in response to an operation mode selectable by a command from the external device and the first flag signal;
   store the main data in the normal cell region;
   store either the external parity or the first flag signal in the second sub parity region in response to the operation mode; and
   perform an ECC decoding operation on the main data read from the normal cell region to generate a corrected main data in response to the operation mode and the first flag signal,
   wherein the interface circuit stores the generated internal parity in the first sub parity region when the ECC encoding operation is performed.

2. The semiconductor memory device of claim 1, wherein the interface circuit is configured to:
   generate duplicated flag signals by duplicating the first flag signal odd number of times;
   store the duplicated flag signals in the second sub parity region instead of the first flag signal, in response to the operation mode;
   perform the ECC encoding operation on the main data to generate the internal parity, in response to the operation mode and the duplicated flag signals instead of the first flag signal; and
   perform the ECC decoding operation on the main data read from the normal cell region to generate the corrected main data, in response to the operation mode and the duplicated flag signals instead of the first flag signal.

3. The semiconductor memory device of claim 2, wherein the interface circuit is configured to store the main data and one of the external parity and the duplicated flag signals in the same page of the normal cell region and the second sub parity region, respectively, connected to the same word-line.

4. The semiconductor memory device of claim 2, wherein, in response to an external ECC mode of the operation mode, the interface circuit is configured to:
   receive the external parity as the sub data;
   perform the ECC encoding operation on the main data to generate the internal parity; and
   store the internal parity and the external parity in the first sub parity region and the second sub parity region, respectively.

5. The semiconductor memory device of claim 2, wherein, in response to a data mask mode of the operation mode, the interface circuit is configured to:
   receive the data mask signal as the sub data;
   perform a logic operation on the mask bits of the data mask signal to generate the first flag signal;
   perform the ECC encoding operation based on a logic level of the first flag signal;
   generate the duplicated flag signals based on the first flag signal; and
   store the duplicated flag signals in the second sub parity region.

6. The semiconductor memory device of claim 2, wherein the interface circuit is configured to perform a majority voting operation on the duplicated flag signals read from the second sub parity region and perform the ECC decoding operation on the main data read from the normal cell region based on a result of the majority voting operation in a read operation of the semiconductor memory device.

7. The semiconductor memory device of claim 1, further comprising:
   a buffer die including the interface circuit and configured to communicate with the external device, the first memory die being stacked on the buffer die;
   an additional plurality of second memory dies stacked on the first memory die; and
   a plurality of through substrate vias (TSVs) extending through the first memory die and the plurality of second memory dies to connect to the buffer die,
   wherein each of the plurality of second memory dies includes the memory cell array.

8. The semiconductor memory device of claim 7, wherein the buffer die includes an internal command generator configured to provide the interface circuit with a mode signal designating the operation mode as one of an external ECC mode and a data mask mode,
   wherein the interface circuit further includes:
   a mode flag generator configured to generate the first flag signal designating one of a normal write operation and a masked write operation based on the mask bits of the data mask signal included in the sub data in the data mask mode;

a repeated code generator configured to generate duplicated flag signals based on the first flag signal; and a majority voter configured to perform a majority voting operation on the duplicated flag signals read from the second sub parity region to generate a second flag signal; and a selection signal generator configured to generate a selection signal in response to the mode signal and the first and second flag signals, and wherein the ECC engine is configured to perform the ECC encoding operation and configured to perform the ECC decoding operation in response to the mode signal, the first flag signal and the second flag signal.

9. The semiconductor memory device of claim 8, wherein the mode flag generator includes an OR gate that performs an OR operation on the mask bits of the data mask signal to output the first flag signal, and wherein the first flag signal designates the masked write operation in response to at least one of the mask bits being a first logic level.

10. The semiconductor memory device of claim 8, wherein the ECC engine includes an ECC encoder configured to perform the ECC encoding operation on the main data to generate the internal parity in response to the mode signal designating the external ECC mode or the first flag signal designating the normal write operation.

11. The semiconductor memory device of claim 8, wherein the ECC engine includes an ECC decoder configured to:

be disabled in response to the second flag signal having a first logic level, and perform the ECC decoding operation on the main data read from the normal cell region and the internal parity, in response to the second flag signal having a second logic level different from the first logic level.

12. The semiconductor memory device of claim 8, wherein the interface circuit further includes a first path control circuit connected to the external device and a second path control circuit connected to a portion of the TSVs, wherein, in a write operation of the semiconductor memory device, the first path control circuit is configured to:

provide the second path control circuit with the external parity as the sub data in response to the mode signal designating the external ECC mode; and provide the mask bits to the mode flag generator and provide the main data to the ECC engine and the second path control circuit, in response to the mode signal designating the data mask mode, and wherein the second path control circuit is configured to:

provide the external parity to the second sub parity region in response to the mode signal designating the external ECC mode;

provide the duplicated flag signals to the second sub parity region and provide the main data to the normal cell region in response to the mode signal designating the external ECC mode; and provide the internal parity to the first sub parity region in response to the mode signal designating the external ECC mode or the first flag signal having a second logic level.

13. The semiconductor memory device of claim 8, wherein the interface circuit further includes a first path control circuit connected to the external device and a second path control circuit connected to a portion of the TSVs, wherein, in a read operation of the semiconductor memory device, the second path control circuit is configured to:

provide the external parity to the first path control circuit in response to the mode signal designating the external ECC mode; and provide the duplicated flag signals to the majority voter and provide the main data to the ECC engine in response to the mode signal designating the data mask mode, and wherein the first path control circuit is configured to:

provide the external parity to the external device in response to the mode signal designating the external ECC mode; and provide the external device with one of the main data from the normal cell region and the corrected main data from the ECC engine in response to the selection signal.

14. A memory system comprising:

a memory controller including a first error correction code (ECC) engine, and configured to generate a command, main data and sub data, the main data and the sub data being generated in response to a first data; and a semiconductor memory device configured to receive the command, the main data and the sub data from the memory controller, wherein the semiconductor memory device includes:

a first memory die including a memory cell array including a plurality of memory cells coupled to a plurality of word-lines and a plurality of bit-lines, wherein the memory cell array includes a normal cell region and a parity cell region that includes a first sub parity region and a second sub parity region; and an interface circuit including a second ECC engine, and the interface circuit configured to:

receive the main data and the sub data from the memory controller, the sub data comprising external parity or a data mask signal;

generate a flag signal based on mask bits of the data mask signal;

perform an ECC encoding operation on the main data to generate internal parity in response to an operation mode selectable by the command and the flag signal;

store the main data in the normal cell region;

store either the external parity or the flag signal in the second sub parity region in response to the operation mode; and perform an ECC decoding operation on the main data read from the normal cell region to generate a corrected main data in response to the operation mode and the flag signal, wherein the interface circuit stores the generated internal parity in the first sub parity region when the ECC encoding operation is performed.

15. The memory system of claim 14, wherein the interface circuit is further configured to:

generate duplicated flag signals by duplicating the flag signal odd number of times;

store the duplicated flag signals in the second sub parity region instead of the flag signal, in response to the operation mode;

perform the ECC encoding operation on the main data to generate the internal parity, in response to the operation mode and the duplicated flag signals instead of the flag signal; and perform the ECC decoding operation on the main data read from the normal cell region to generate the corrected main data, in response to the operation mode and the duplicated flag signals instead of the flag signal.

16. The memory system of claim 14, wherein the memory controller further includes:
- a data mask generator configured to generate the mask bits in response to a mask signal from a host, wherein each of the mask bits designates whether to write corresponding unit data in the first data;
- a central processing unit (CPU) configured to control the data mask generator and the first ECC engine and configured to generate a first mode signal and the first data, in response to data and the mask signal from the host; and
- a selection circuit configured to provide one of the external parity and the data mask signal including the mask bits as the sub data in response to the first mode signal,
wherein the first ECC engine includes an ECC encoder configured to generate the external parity based on the first data.

17. The memory system of claim 14, wherein the semiconductor memory device further includes:
- a buffer die including the interface circuit and configured to communicate with the memory controller, the first memory die being stacked on the buffer die;
- an additional plurality of second memory dies stacked on the first memory die; and
- a plurality of through substrate vias (TSVs) extending through the first memory die and the plurality of second memory dies to connect to the buffer die,
wherein each of plurality of second memory dies includes the memory cell array, and
wherein the buffer die further includes an internal command generator configured to provide the interface circuit with a second mode signal designating the operation mode as one of an external ECC mode and a data mask mode.

18. The memory system of claim 14, wherein the interface circuit is configured to store the main data and one of the external parity and the flag signal in the same page of the normal cell region and the second sub parity region, respectively, connected to the same word-line.

19. A method of operating a semiconductor memory device, wherein the semiconductor memory device includes a buffer die to communicate with an external device, one or more memory dies stacked on the buffer die, a plurality of through substrate vias (TSVs) extending through the one or more memory dies to connect to the buffer die, wherein each of the one or more memory dies includes a memory cell array, and wherein the memory cell array includes a plurality of memory cells coupled to a plurality of word-lines and a plurality of bit-lines and includes a normal cell region and a parity cell region that includes a first sub parity region and a second sub parity region, the method comprising:
- receiving a first command, main data and sub data from the external device;
- determining whether the first command designates an external ECC mode or a data mask mode;
- storing the main data in the normal cell region in response to the first command designating the external ECC mode or the data mask mode;
- storing external parity of the sub data in the second sub parity region in response to the first command designating the external ECC mode;
- storing a flag signal in the second sub parity region, in response to the first command designating the data mask mode, wherein the flag signal is generated based on mask bits of a data mask signal of the sub data;
- receiving a second command from the external device; and
- in response to the second command and a logic level of the flag signal read from the second sub parity region, performing an ECC decoding operation on the main data read from the normal cell region.

20. The method of claim 19, wherein the storing of the main data and one of the external parity and the flag signal is performed in the same page of the normal cell region and the second sub parity region, respectively, connected to the same word-line.

* * * * *